United States Patent
Osawa et al.

(10) Patent No.: US 10,879,088 B2
(45) Date of Patent: Dec. 29, 2020

(54) SUBSTRATE TREATMENT METHOD AND SUBSTRATE TREATMENT DEVICE

(71) Applicant: SCREEN Holdings Co., Ltd., Kyoto (JP)

(72) Inventors: Mizuki Osawa, Kyoto (JP); Hiroshi Ebisui, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/637,956

(22) PCT Filed: Jul. 31, 2018

(86) PCT No.: PCT/JP2018/028678
§ 371 (c)(1),
(2) Date: Feb. 10, 2020

(87) PCT Pub. No.: WO2019/044334
PCT Pub. Date: Mar. 7, 2019

(65) Prior Publication Data
US 2020/0176274 A1    Jun. 4, 2020

(30) Foreign Application Priority Data
Aug. 28, 2017 (JP) .................................. 2017-163538

(51) Int. Cl.
*H01L 21/67* (2006.01)
(52) U.S. Cl.
CPC ................. *H01L 21/6708* (2013.01)
(58) Field of Classification Search
CPC .................................................. H01L 21/6708
See application file for complete search history.

(56) References Cited

U.S. PATENT DOCUMENTS

2009/0311874 A1 12/2009 Tomita et al. ............... 438/759
2014/0060423 A1 3/2014 Nakai et al.
(Continued)

FOREIGN PATENT DOCUMENTS

JP    2010-230352 A    10/2010
JP    2012-178606 A    9/2012
(Continued)

OTHER PUBLICATIONS

International Search Report dated Sep. 25, 2018 in corresponding PCT International Application No. PCT/JP2018/028678.
(Continued)

*Primary Examiner* — Roberts P Culbert
(74) *Attorney, Agent, or Firm* — Ostrolenk Faber LLP

(57) ABSTRACT

A substrate processing method includes the steps of: rotating a substrate horizontally around a vertical rotational axis, placing a facing member facing the substrate from above such that an inner peripheral surface of an extension portion of the facing member faces the substrate radially from the outside, rotating the facing member around the rotational axis, supplying a processing liquid to an upper surface of the substrate being in a rotated state, and placing a guard that surrounds the substrate further radially outside from the extension portion in plan view at a height position, at which processing liquid scattered from the upper surface of the substrate toward the outside in the radial direction is received by the guard, in accordance with affinity of the processing liquid for the inner peripheral surface of the extension portion.

8 Claims, 13 Drawing Sheets

(56) References Cited

U.S. PATENT DOCUMENTS

| | | | |
|---|---|---|---|
| 2015/0234296 A1 | 8/2015 | Yagi | |
| 2016/0351421 A1 | 12/2016 | Iwao et al. | |
| 2016/0365260 A1 | 12/2016 | Iwao et al. | |
| 2018/0087836 A1* | 3/2018 | Yoshihara | F26B 9/10 |
| 2018/0204743 A1 | 7/2018 | Otsuji et al. | |
| 2018/0221925 A1 | 8/2018 | Ito et al. | |

FOREIGN PATENT DOCUMENTS

| | | |
|---|---|---|
| JP | 2014-049606 A | 3/2014 |
| JP | 2015-153947 A | 8/2015 |
| JP | 2016-225427 A | 12/2016 |
| JP | 2017-005195 A | 1/2017 |
| JP | 2017-034235 A | 2/2017 |
| WO | WO 2015/029563 A1 | 3/2015 |
| WO | WO 2017/029862 A1 | 2/2017 |

OTHER PUBLICATIONS

Written Opinion dated Sep. 25, 2018 in corresponding PCT International Application No. PCT/JP2018/028678.

International Preliminary Report on Patentability (Chapter I) dated Mar. 12, 2020 with a Notification from the International Bureau (Form PCT/IB/326) in corresponding PCT International Application No. PCT/JP2018/028678 in Japanese.

English translation of the International Preliminary Report on Patentability (Chapter I) dated Mar. 12, 2020 with a Notification from the International Bureau (Form PCT/IB/338) in corresponding PCT International Application No. PCT/JP2018/02678.

* cited by examiner

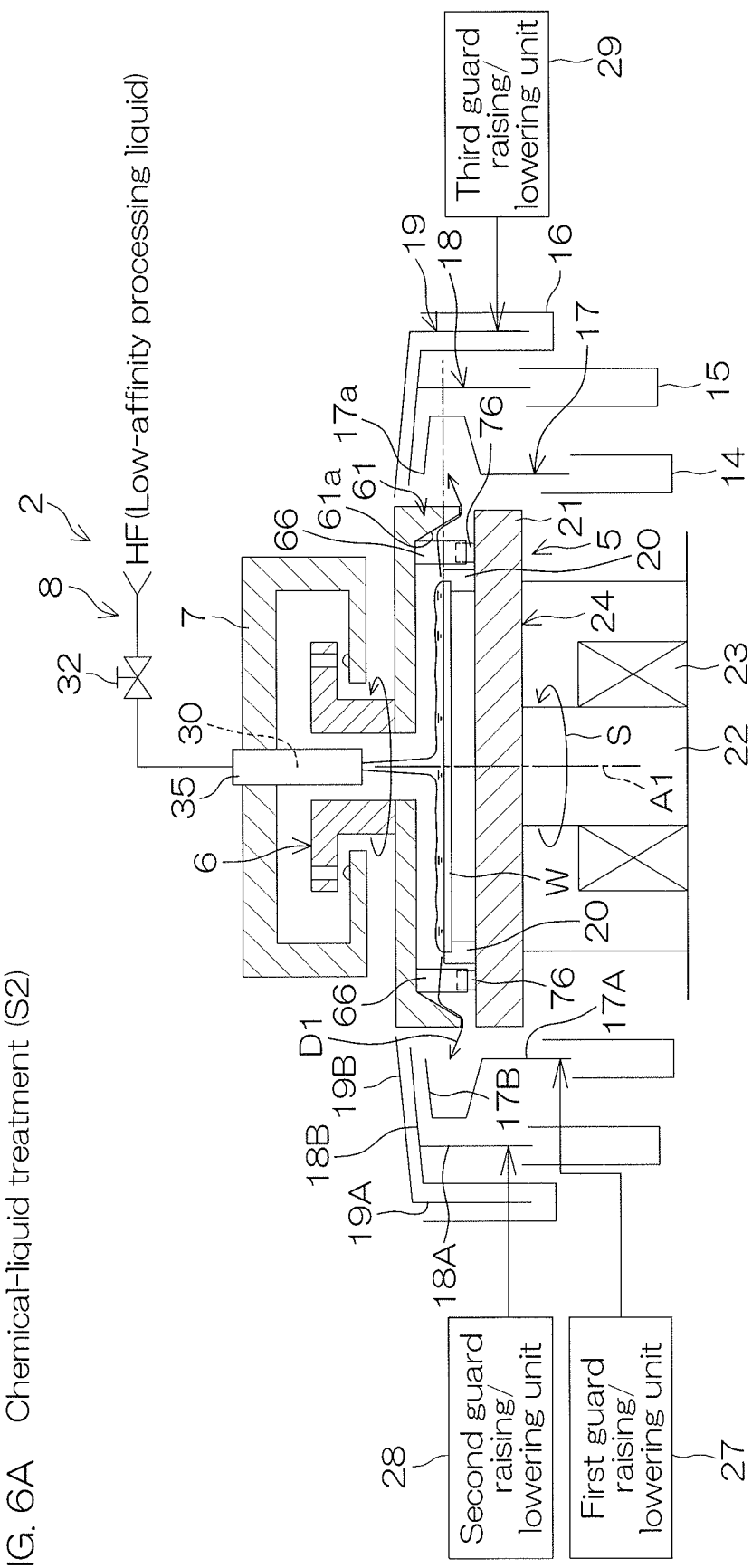
FIG. 6A  Chemical-liquid treatment (S2)

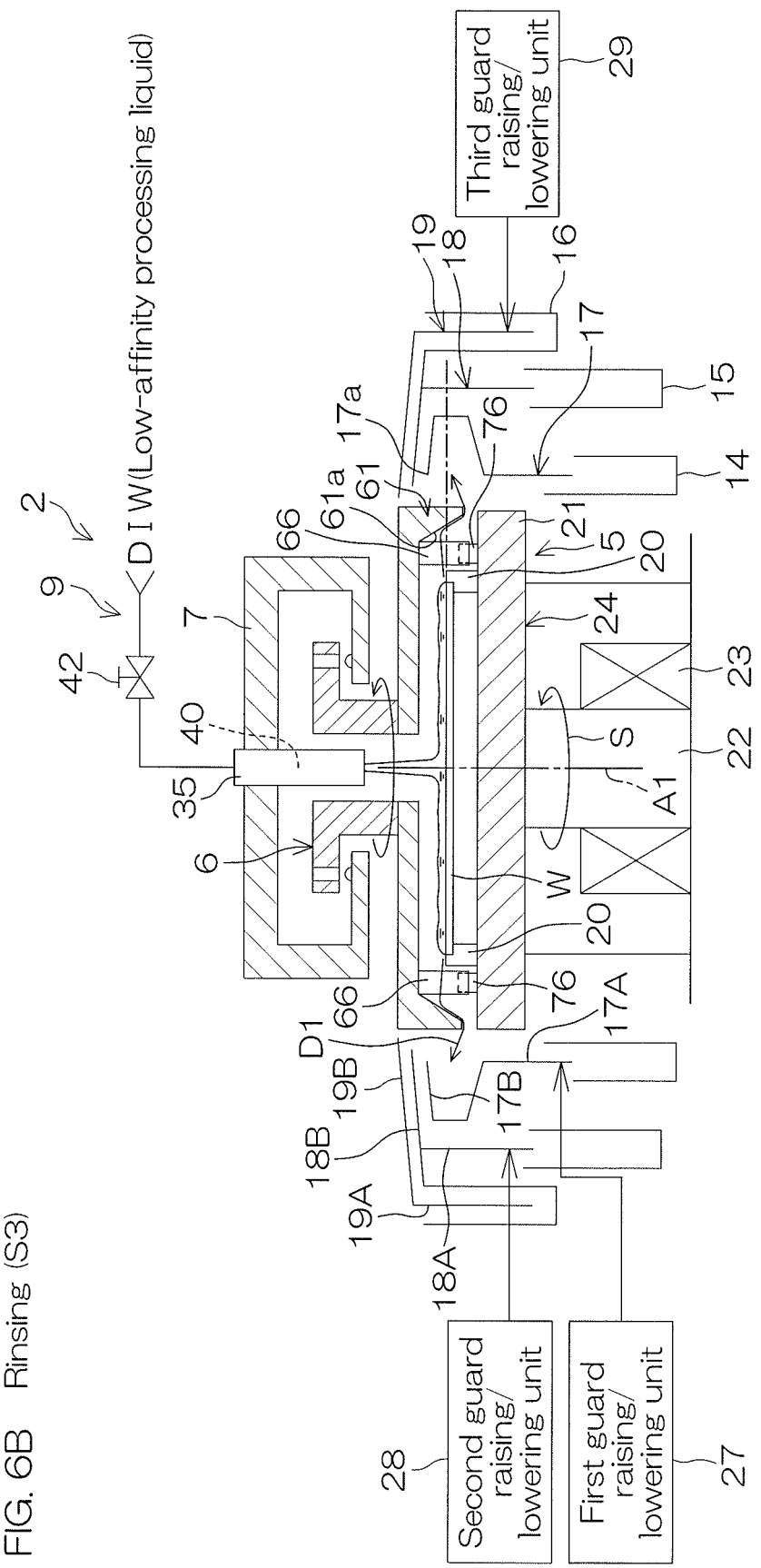
FIG. 6B  Rinsing (S3)

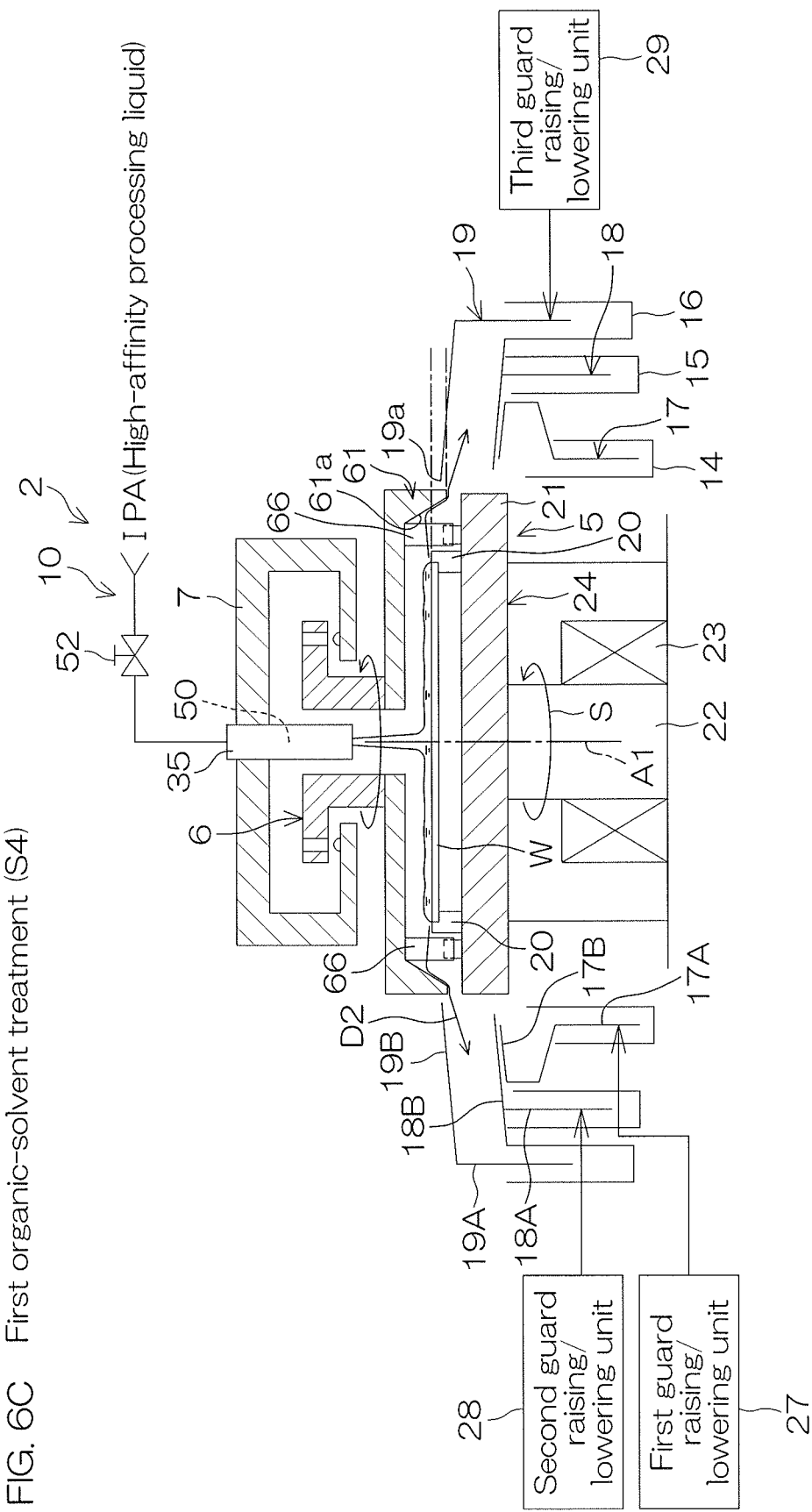
FIG. 6C  First organic-solvent treatment (S4)

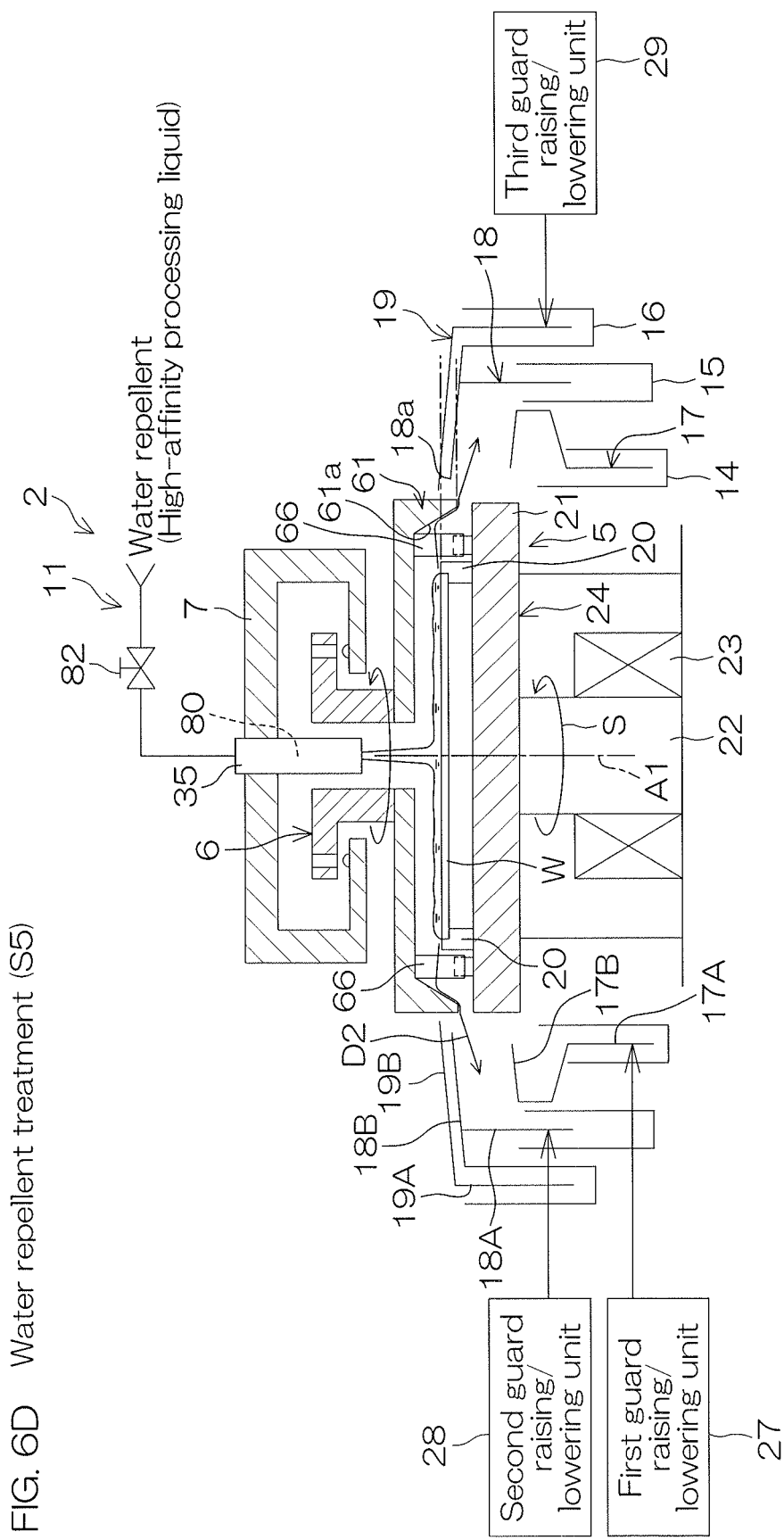
FIG. 6D  Water repellent treatment (S5)

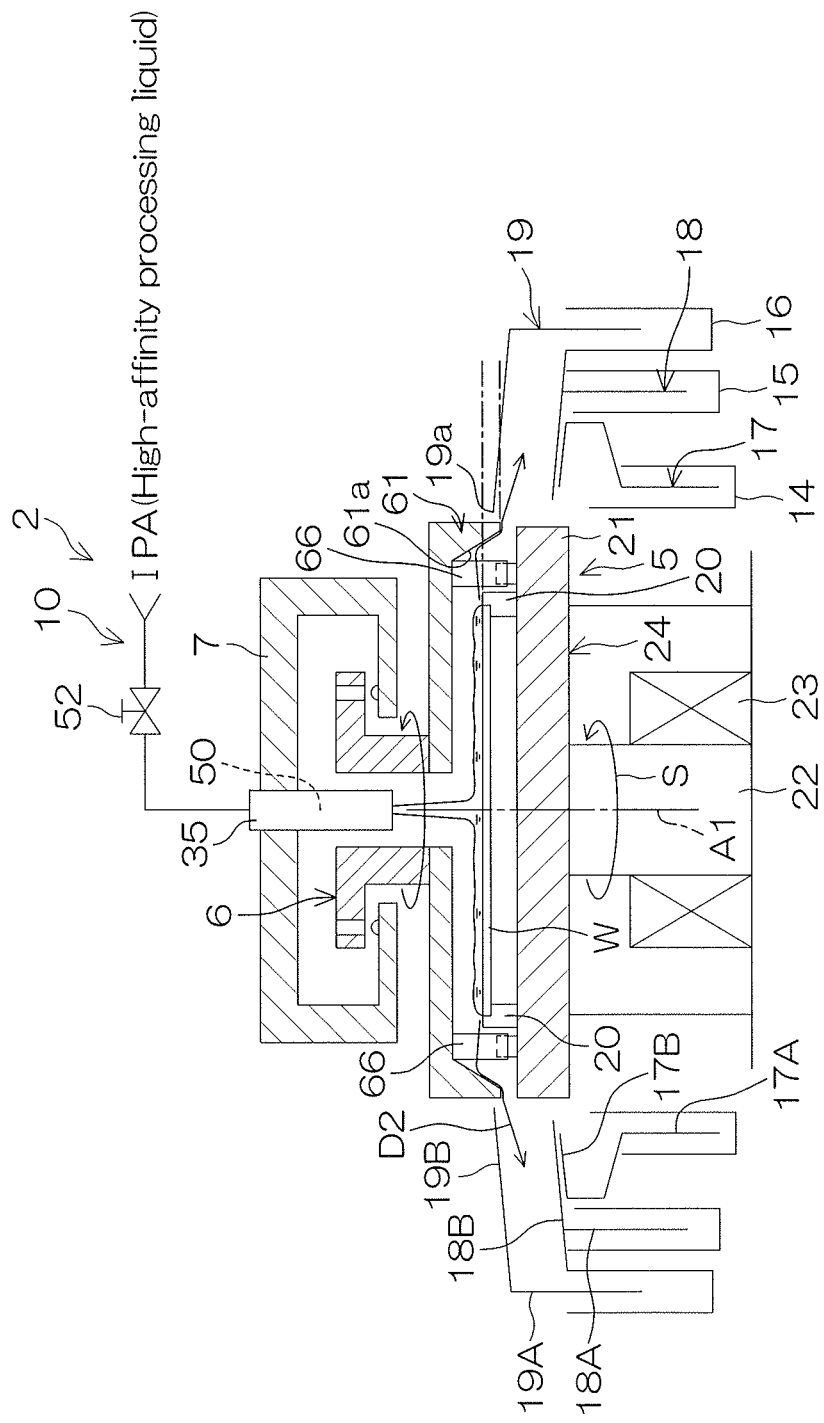
FIG. 6E  Second organic-solvent treatment (S6)

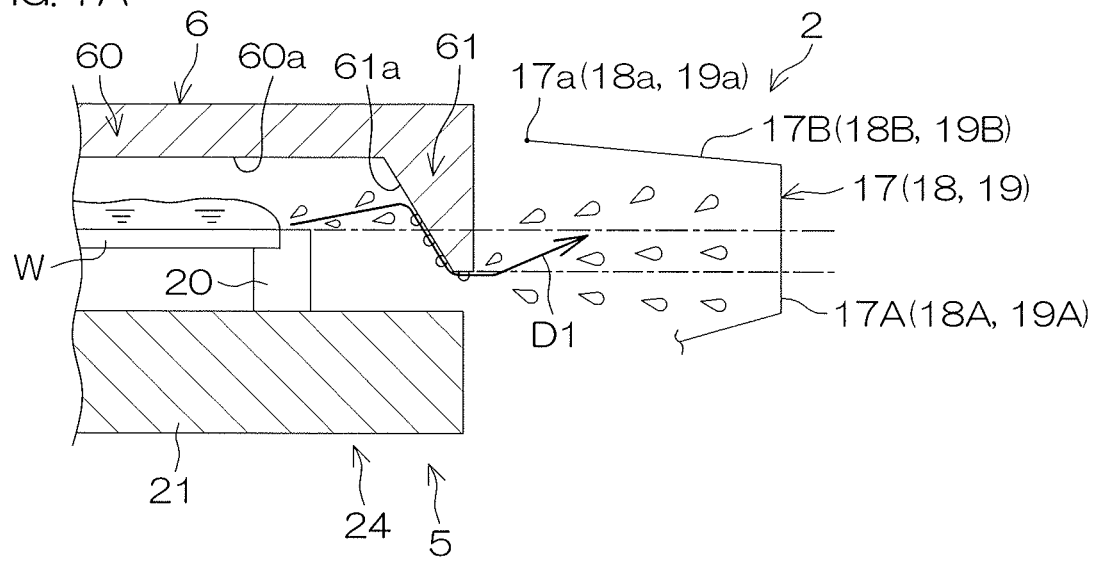
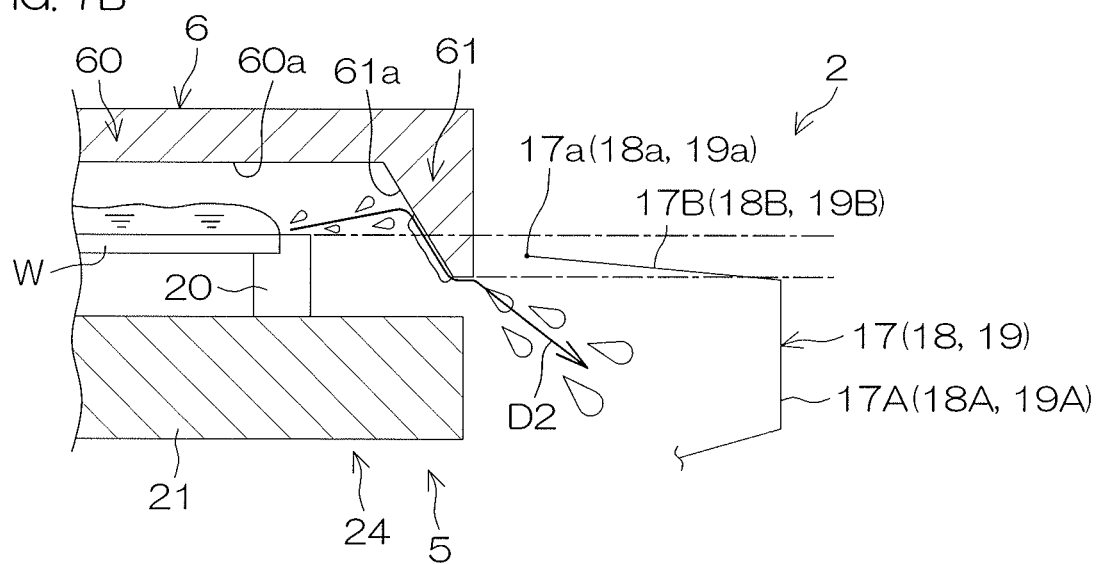

SUBSTRATE TREATMENT METHOD AND SUBSTRATE TREATMENT DEVICE

CROSS-REFERENCE TO RELATED APPLICATIONS

The present application is a 35 U.S.C. §§ 371 national phase conversion of PCT/JP2018/028678, filed Jul. 31, 2018, which claims priority to Japanese Patent Application No. 2017-163538, filed Aug. 28, 2017, the contents of both of which are incorporated herein by reference. The PCT International Application was published in the Japanese language.

TECHNICAL FIELD

The present invention relates to a substrate processing method and a substrate processing apparatus for processing a substrate. Examples of substrates to be processed include semiconductor wafers, substrates for liquid crystal displays, substrates for flat panel displays (FPD) such as organic electroluminescence (EL) displays, substrates for optical disks, substrates for magnetic disks, substrates for magneto-optical disks, substrates for photomasks, ceramic substrates, substrates for solar cells, etc.

BACKGROUND ART

In substrate processing performed by a substrate processing apparatus of a single substrate processing type that processes substrates one by one, for example, a processing liquid is supplied to a substrate that rotates in a state of being substantially horizontally held by a spin chuck. The processing liquid supplied to the substrate is scattered outwardly from the substrate by means of a centrifugal force. The processing liquid that has been scattered outwardly from the substrate is received by a cup (guard) surrounding the spin chuck.

In substrate processing performed by a substrate processing apparatus described in Patent Literature 1 mentioned below, diluted hydrofluoric acid, deionized water (DIW), isopropyl alcohol (IPA), or the like is used as a processing liquid. In detail, a front surface of a substrate is treated by supplying diluted hydrofluoric acid to the substrate. Thereafter, DIW is supplied to an upper surface of the substrate, and, as a result, the diluted hydrofluoric acid on the substrate is replaced by the DIW. Thereafter, IPA is supplied to the upper surface of the substrate, and, as a result, the DIW on the substrate is replaced by the IPA. Thereafter, the IPA is shaken off from the substrate, and, as a result, the upper surface of the substrate becomes dry.

CITATION LIST

Patent Literature

Patent Literature 1: United States Patent Application Publication No. 2015/234296

SUMMARY OF INVENTION

Technical Problem

In the substrate processing performed by the substrate processing apparatus described in Patent Literature 1, a blocking member that includes a disk portion having a lower surface facing a substrate and an extension portion extending downwardly from the disk portion is provided. The blocking member rotates together with the spin chuck. Therefore, when the blocking member is at a position close to the upper surface of the substrate, the processing liquid that has been scattered from the substrate collides with an inner peripheral surface of the extension portion of the blocking member. Thereafter, the processing liquid adhering to the inner peripheral surface of the extension portion is scattered from the blocking member by means of a centrifugal force, and is received by the guard.

Here, the remaining capability of the processing liquid, which has adhered to the blocking member, on the blocking member depends on the wettability of the processing liquid with respect to the blocking member. Therefore, the scattering direction of the processing liquid that is scattered from the blocking member depends on the wettability of the processing liquid with respect to the blocking member. Therefore, in the substrate processing described in Patent Literature 1, there is a concern that the processing liquid will not be received by the guard, and will be scattered outwardly beyond the guard depending on the direction of the processing liquid being scattered from the blocking member. If so, there is a fear that the processing liquid cannot be collected and that the inside of the substrate processing apparatus will be contaminated with the processing liquid.

Therefore, an object of the present invention is to provide a substrate processing method and a substrate processing apparatus that are capable of excellently receiving a processing liquid by means of a guard regardless of the kind of the processing liquid.

Solution to Problem

One preferred embodiment of the present invention provides a substrate processing method that includes a substrate rotating step of rotating a substrate that is held horizontally around a rotational axis extending in a vertical direction, a facing member placing step of placing a facing member that includes an extension portion having an inner peripheral surface surrounding the substrate in a plan view and that faces the substrate from above at a position at which the inner peripheral surface of the extension portion faces the substrate from an outer side in a radial direction that centers on the rotational axis, a facing member rotating step of rotating the facing member around the rotational axis, a processing-liquid supplying step of supplying a processing liquid to an upper surface of the substrate being in a rotated state, and a guard placing step of placing a guard that surrounds the substrate on an outer side in the radial direction than the extension portion in a plan view at a height position that enables reception of the processing liquid that is scattered from the upper surface of the substrate outwardly in accordance with affinity of the processing liquid for the inner peripheral surface of the extension portion.

According to this method, the processing liquid that is scattered from the upper surface of the substrate to the outer side in the radial direction centering on the rotational axis is once received by the inner peripheral surface of the extension portion of the facing member, and is then scattered from the extension portion to the outer side in the radial direction, and, as a result, is received by the guard. The guard is placed at an appropriate height position in accordance with the affinity of the processing liquid for the inner peripheral surface of the extension portion. Therefore, it is possible to excellently receive the processing liquid by means of the guard regardless of the kind (affinity for the inner peripheral surface of the extension portion) of the processing liquid supplied to the substrate.

Here, affinity for the inner peripheral surface of the extension portion denotes wettability for the inner peripheral surface of the extension portion. A processing liquid that is high in affinity for the inner peripheral surface of the extension portion is a processing liquid that is wettable for the inner peripheral surface of the extension portion. A processing liquid that is low in affinity for the inner peripheral surface of the extension portion is a processing liquid that is less wettable for the inner peripheral surface of the extension portion. It becomes easier for the processing liquid to adhere to the inner peripheral surface of the extension portion in proportion to an increase in the affinity of the processing liquid for the inner peripheral surface of the extension portion. It becomes more difficult for the processing liquid to adhere to the inner peripheral surface of the extension portion in proportion to a decrease in the affinity of the processing liquid for the inner peripheral surface of the extension portion.

In one preferred embodiment of the present invention, the processing-liquid supplying step includes a low-affinity processing liquid supplying step of supplying a low-affinity processing liquid to the upper surface of the substrate and a high-affinity processing liquid supplying step of supplying a high-affinity processing liquid whose affinity for the inner peripheral surface of the extension portion is higher than the low-affinity processing liquid to the upper surface of the substrate. The guard placing step includes a first placing step of placing the guard at a first liquid receiving position when the guard receives the low-affinity processing liquid and a second placing step of placing the guard at a second liquid receiving position lower than the first liquid receiving position when the guard receives the high-affinity processing liquid.

It is more difficult for the high-affinity processing liquid to recede from the inner peripheral surface of the extension portion of the facing member than the low-affinity processing liquid. Therefore, the high-affinity processing liquid that has adhered to the inner peripheral surface more easily forms a liquid droplet larger than the low-affinity processing liquid. The liquid droplet receives its own weight, and hence more easily falls downwardly from the inner peripheral surface of the extension portion in proportion to an increase in size of the liquid droplet. Therefore, the scattering direction of the high-affinity processing liquid is inclined more downwardly than the scattering direction of the low-affinity processing liquid.

Therefore, the guard is placed at an appropriate position by setting the second liquid receiving position (position of the guard when the high-affinity processing liquid is received) lower than the first liquid receiving position (position of the guard when the low-affinity processing liquid is received). Therefore, the processing liquid is excellently received by the guard regardless of the kind of the processing liquid.

Preferably, in the first placing step, the guard is placed such that an upper end of the guard is placed higher than the upper surface of the substrate, and, in the second placing step, the guard is placed such that the upper end of the guard is placed at a position lower than the upper surface of the substrate and at a position higher than a lower end portion of the extension portion. In the guard placing step, the guard is placed in this way, and, as a result, the processing liquid is more excellently received by the guard.

According to one preferred embodiment of the present invention, the processing-liquid supplying step includes a first replacing step of replacing the low-affinity processing liquid on the upper surface of the substrate with the high-affinity processing liquid by performing the high-affinity processing liquid supplying step after completing the low-affinity processing liquid supplying step. The guard placing step includes a step of changing the height position of the guard so that the guard is placed at the first liquid receiving position when the first replacing step is started and so that the guard is placed at the second liquid receiving position after the first replacing step is ended.

In the first replacing step, the liquid that is scattered from the substrate is a mixture consisting of the low-affinity processing liquid and the high-affinity processing liquid. In the first replacing step, the low-affinity processing liquid on the upper surface of the substrate is replaced by the high-affinity processing liquid, and therefore the low-affinity processing liquid is contained in the liquid that is scattered from the substrate immediately after the start of the first replacing step more than the high-affinity processing liquid. Thereafter, the ratio of the high-affinity processing liquid contained in the liquid scattered from the substrate gradually becomes higher, and the liquid that is scattered from the substrate after ending the first replacing step becomes only the high-affinity processing liquid. Therefore, the guard is placed at the first liquid receiving position when the first replacing step is started, and the guard is placed at the second liquid receiving position after the first replacing step is ended, and, as a result, the processing liquid is more excellently received by the guard.

In one preferred embodiment of the present invention, the processing-liquid supplying step includes a second replacing step of replacing the high-affinity processing liquid on the upper surface of the substrate with the low-affinity processing liquid by performing the low-affinity processing liquid supplying step after completing the high-affinity processing liquid supplying step. The guard placing step includes a step of changing the height position of the guard such that the guard is placed at the second liquid receiving position when the second replacing step is started and such that the guard is placed at the first liquid receiving position after the second replacing step is ended.

In the second replacing step, the liquid that is scattered from the substrate is a mixture consisting of the low-affinity processing liquid and the high-affinity processing liquid. In the second replacing step, the high-affinity processing liquid on the upper surface of the substrate is replaced by the low-affinity processing liquid, and therefore the high-affinity processing liquid is contained in the liquid that is scattered from the substrate immediately after the start of the second replacing step more than the low-affinity processing liquid. Thereafter, the ratio of the low-affinity processing liquid contained in the liquid scattered from the substrate gradually becomes higher, and the liquid that is scattered from the substrate after ending the second replacing step becomes only the low-affinity processing liquid. Therefore, the guard is placed at the second liquid receiving position when the second replacing step is started, and the guard is placed at the first liquid receiving position after the second replacing step is ended, and, as a result, the processing liquid is more excellently received by the guard.

In one preferred embodiment of the present invention, the guard includes a guard for a low-affinity processing liquid that receives the low-affinity processing liquid and a guard for a high-affinity processing liquid that receives the high-affinity processing liquid. The guard placing step includes a low-affinity-processing-liquid-guard placing step of placing the guard for the low-affinity processing liquid at the first liquid receiving position and a high-affinity-processing-liquid-guard placing step of placing the guard for the high-affinity processing liquid at the second liquid receiving position.

According to this method, the low-affinity processing liquid and the high-affinity processing liquid are respectively received by the different guards (individual guards). It is possible to place each of the guard for the low-affinity processing liquid and the guard for the high-affinity processing liquid at an appropriate position in accordance with the kind of the processing liquid. Therefore, the processing liquid that is scattered from the substrate is more excellently received by the guard.

A centrifugal force that acts on a processing liquid being scattered from the substrate becomes larger in proportion to an increase in the rotational speed of the substrate. Therefore, the scattering direction of the processing liquid from the substrate is inclined more upwardly in proportion to an increase in the rotational speed of the substrate.

In one preferred embodiment of the present invention, the guard placing step includes a step of adjusting a position of the guard such that the guard is placed at a higher position in proportion to an increase in rotational speed of the substrate. Therefore, it is possible to place the guard at a more appropriate position to receive the processing liquid in the guard placing step.

One preferred embodiment of the present invention provides a substrate processing apparatus that includes a substrate holding unit that horizontally holds a substrate, a substrate rotating unit that rotates the substrate around a rotational axis that extends in a vertical direction, a processing liquid supply unit that supplies a processing liquid to an upper surface of the substrate, a facing member that includes an extension portion having an inner peripheral surface surrounding the substrate in a plan view and that faces the substrate from above, a guard that surrounds the substrate at a further outer side in a radial direction that centers on the rotational axis than the extension portion in a plan view, a guard raising/lowering unit that raises and lowers the guard, a facing member raising/lowering unit that raises and lowers the facing member, a facing-member rotating unit that rotates the facing member around the rotational axis, and a controller that controls the substrate rotating unit, the processing liquid supply unit, the guard raising/lowering unit, the facing member raising/lowering unit, and the facing-member rotating unit.

The controller is programmed to execute a substrate rotating step of rotating the substrate that is held horizontally around the rotational axis by means of the substrate rotating unit, a facing member placing step of placing the facing member at a position at which the inner peripheral surface of the extension portion faces the substrate from an outer side in the radial direction by means of the facing member raising/lowering unit, a facing member rotating step of rotating the facing member around the rotational axis by means of the facing-member rotating unit, a processing-liquid supplying step of supplying the processing liquid from the processing liquid supply unit to the upper surface of the substrate being in a rotated state, and a guard placing step of placing the guard at a height position, at which the processing liquid that is scattered from the upper surface of the substrate toward the outer side in the radial direction is received by the guard, in accordance with affinity of the processing liquid for the inner peripheral surface of the extension portion by means of the guard raising/lowering unit.

According to this configuration, the guard is placed at an appropriate height position in accordance with the affinity of the processing liquid for the inner peripheral surface of the extension portion. Therefore, it is possible to excellently receive the processing liquid by means of the guard regardless of the kind (affinity for the inner peripheral surface of the extension portion) of the processing liquid supplied to the substrate.

The above and other elements, features, steps, characteristics and advantages of the present invention will become more apparent from the following detailed description of the preferred embodiments with reference to the attached drawings.

BRIEF DESCRIPTION OF DRAWINGS

FIG. 6A is an illustrative cross-sectional view to describe the first example of the substrate processing.

FIG. 6B is an illustrative cross-sectional view to describe the first example of the substrate processing.

FIG. 6C is an illustrative cross-sectional view to describe the first example of the substrate processing.

FIG. 6D is an illustrative cross-sectional view to describe the first example of the substrate processing.

FIG. 6E is an illustrative cross-sectional view to describe the first example of the substrate processing.

FIG. 7A is an illustrative cross-sectional view to describe the height position of the guard when a low-affinity processing liquid is received in the first example of the substrate processing.

FIG. 7B is an illustrative cross-sectional view to describe the height position of the guard when a high-affinity processing liquid is received in the first example of the substrate processing.

DESCRIPTION OF EMBODIMENTS

Figure 1:
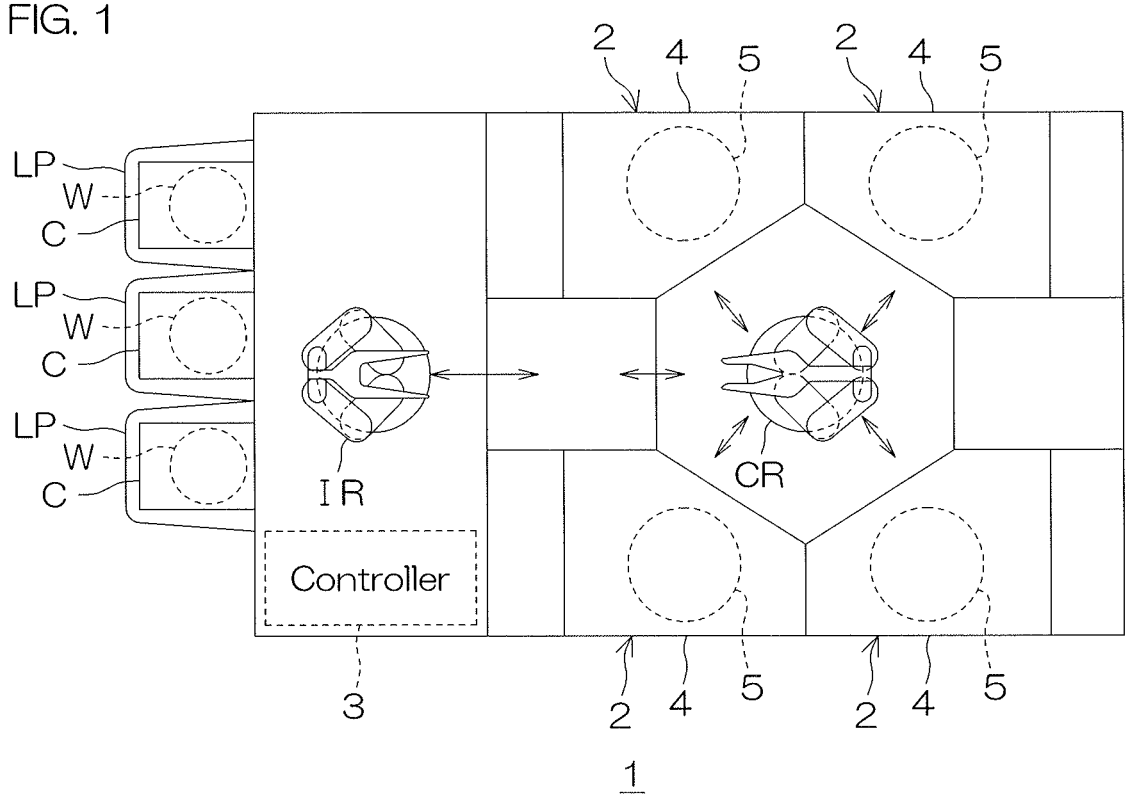
FIG. 1 is a schematic plan view to describe a layout on the inside of a substrate processing apparatus according to a preferred embodiment of the present invention.

FIG. 1 is an illustrative plan view to describe a layout on the inside of a substrate processing apparatus 1 according to a preferred embodiment of the present invention.

The substrate processing apparatus 1 is a single substrate processing type apparatus that processes substrates W, such as silicon wafers, one by one. In the present preferred embodiment, the substrate W is a disk-shaped substrate. The substrate processing apparatus 1 includes a plurality of processing units 2 each of which processes a substrate W by use of a processing liquid, a load port LP on which a carrier C that houses a plurality of substrates W to be processed by the processing units 2 is placed, transfer robots IR and CR each of which transfers a substrate W between the load port LP and the processing unit 2, and a controller 3 that controls the substrate processing apparatus 1. The transfer robot IR transfers a substrate W between the carrier C and the transfer robot CR. The transfer robot CR transfers a substrate W between the transfer robot IR and the processing unit 2. For example, the plurality of processing units 2 are each configured in the same way.

Figure 2:
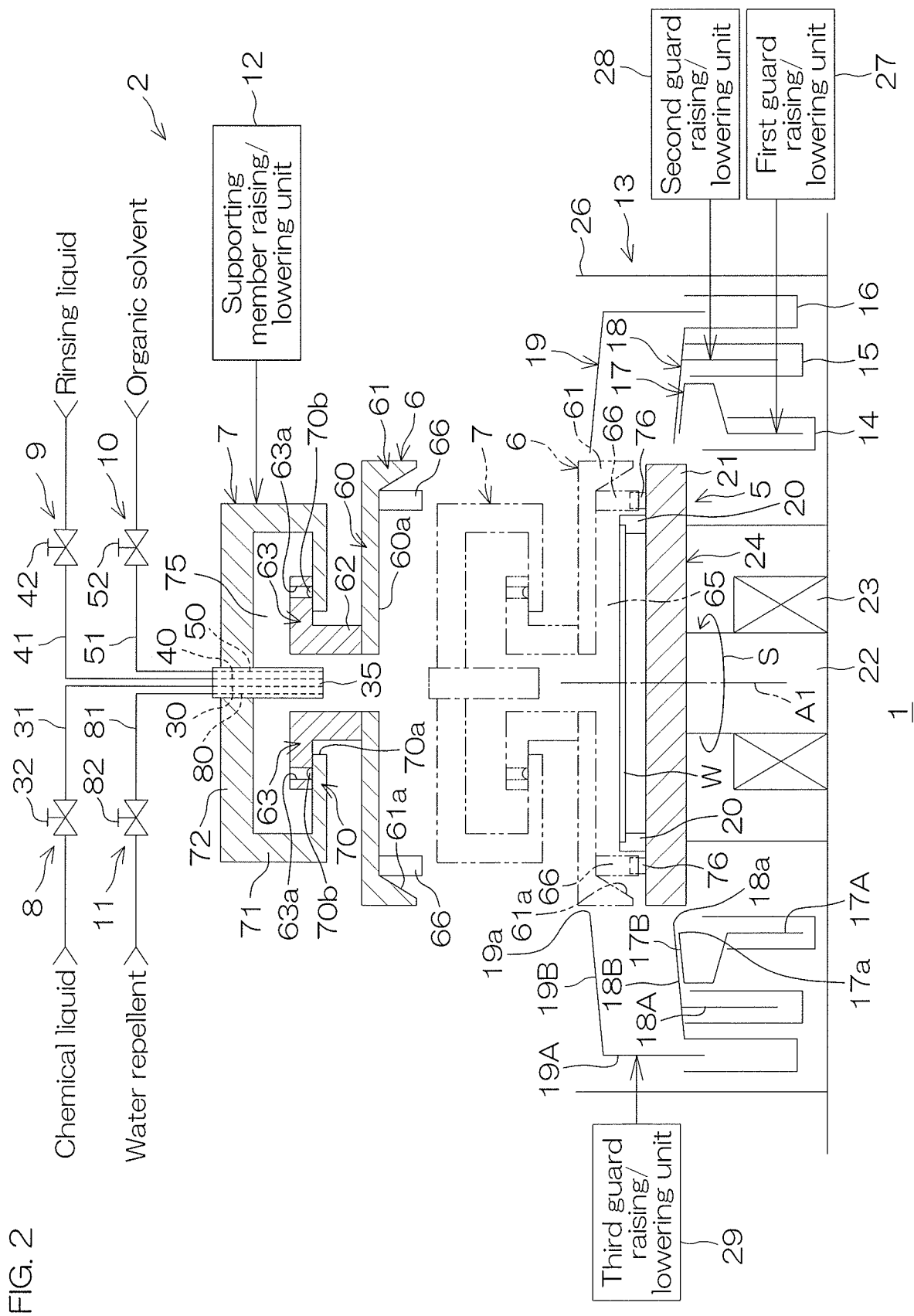
FIG. 2 is a schematic view of a processing unit included in the substrate processing apparatus.

FIG. 2 is a schematic view to describe an configuration example of the processing unit 2.

The processing unit 2 includes a chamber 4 (see FIG. 1), a spin chuck 5, a facing member 6, a supporting member 7, a chemical liquid supply unit 8, a rinsing liquid supply unit 9, an organic solvent supply unit 10, a water repellent supply unit 11, a supporting member raising/lowering unit 12, and a processing cup 13.

The spin chuck 5 rotates a single substrate W around a vertical rotational axis A1 while holding the substrate W in a horizontal attitude. The rotational axis A1 passes through a center of the substrate W. The spin chuck 5 is housed in the chamber 4 (see FIG. 1). The chamber 4 has an entrance-exit opening (not shown) through which a substrate W is carried into the inside of the chamber 4 or through which a substrate W is carried out from the inside of the chamber 4. The chamber 4 is provided with a shutter unit (not shown) that opens and closes the entrance-exit opening.

The spin chuck 5 includes a substrate holding unit 24, a rotational shaft 22, and an electric motor 23. The substrate holding unit 24 horizontally holds a substrate W. The substrate holding unit 24 includes a spin base 21 and a plurality of chuck pins 20. The spin base 21 has a disk shape along a horizontal direction. The plurality of chuck pins 20 are disposed with intervals between the chuck pins 20 in a circumferential direction on an upper surface of the spin base 21. The rotational shaft 22 is joined to a center of a lower surface of the spin base 21. The rotational shaft 22 extends in the vertical direction along the rotational axis A1. The electric motor 23 gives a rotational force to the rotational shaft 22. The rotational shaft 22 is rotated by the electric motor 23, and, as a result, the spin base 21 of the substrate holding unit 24 is rotated. Hence, a substrate W is rotated around the rotational axis A1. A rotational direction around the rotational axis A1 is referred to as a rotational direction S. The electric motor 23 is included in a substrate rotating unit that rotates a substrate W around the rotational axis A1.

The facing member 6 has a substantially circular shape in a plan view. The rotational axis A1 is also a vertical axis passing through a central part of the facing member 6. The facing member 6 is made of a resin. PEEK (polyether ether ketone) or the like can be mentioned as a resin of which the facing member 6 is made. Therefore, the surface of the facing member 6 is a hydrophobic surface. The hydrophobic surface denotes a surface having comparatively high hydrophobicity. The facing member 6 faces an upper surface of a substrate W from above. The facing member 6 blocks an atmosphere in a space 65 between the facing member 6 and the upper surface of the substrate W from a surrounding atmosphere. The facing member 6 is also referred to as a blocking member.

The facing member 6 is capable of engaging with the substrate holding unit 24 by means of, for example, a magnetic force. In detail, the facing member 6 includes a plurality of first engagement portions 66. The first engagement portion 66 extends downwardly from a facing surface 60a of a facing portion 60. The plurality of first engagement portions 66 are spaced out in the rotational direction S. The substrate holding unit 24 includes a plurality of second engagement portions 76 that are capable of engaging with the plurality of first engagement portions 66. The second engagement portion 76 has a protrusion portion, and each of the first engagement portions 66 has a recess portion to which the protrusion portion of the second engagement portion 76 corresponding thereto is fitted. Unlike the present preferred embodiment, the second engagement portion 76 may have a recess portion, and each of the first engagement portions 66 may have a protrusion portion to which the recess portion of the second engagement portion 76 corresponding thereto is fitted. The plurality of second engagement portions 76 are spaced out in the rotational direction S.

The facing member 6 is rotatable together with the substrate holding unit 24 in a state in which each of the first engagement portions 66 of the facing member 6 and the second engagement portion 76 of the substrate holding unit 24 corresponding thereto engage with each other. The facing member 6 rotates together with the substrate holding unit 24 by allowing the electric motor 23 to rotate the spin base 21 when the facing member 6 and the substrate holding unit 24 engage with each other. In other words, the electric motor 23 functions also as a facing-member rotating unit that rotates the facing member 6 around the rotational axis A1.

The facing member 6 includes the facing portion 60, an extension portion 61, a cylindrical portion 62, and a plurality of flange portions 63.

The facing portion 60 faces the upper surface of the substrate W from above. The facing portion 60 is formed in a disk shape. The facing portion 60 is substantially horizontally disposed above the spin chuck 5. The facing portion 60 has the facing surface 60a facing the upper surface of the substrate W. The facing surface 60a is also a lower surface of the facing portion 60.

The extension portion 61 extends downwardly from a peripheral edge portion of the facing portion 60. An inner peripheral surface 61a of the extension portion 61 is inclined with respect to the vertical direction so as to proceed toward a further outer side in a radial direction that centers on the rotational axis A1 in proportion to a downward progression. The inner peripheral surface 61a of the extension portion 61 is a part of the surface of the facing member 6, and hence is a hydrophobic surface. An outer peripheral surface of the extension portion 61 extends along the vertical direction.

Hereinafter, an inner side in the radial direction that centers on the rotational axis A1 is referred to simply as a "radially inner side," whereas an outer side in the radial direction that centers on the rotational axis A1 is referred to simply as a "radially outer side." The extension portion 61 surrounds the substrate W at a further radially inner side than the first guard 17 when the facing member 6 engages with the substrate holding unit 24 (see the alternate long and two short dashed line of FIG. 2). The extension portion 61 faces the substrate W from the radially outer side when the facing member 6 engages with the substrate holding unit 24 (see the alternate long and two short dashed line of FIG. 2).

The cylindrical portion 62 is fixed to an upper surface of the facing portion 60. The plurality of flange portions 63 are disposed at an upper end of the cylindrical portion 62 with intervals between the flange portions 63 in the circumferential direction (rotational direction S) of the cylindrical portion 62. Each of the flange portions 63 extends horizontally from the upper end of the cylindrical portion 62.

A processing liquid used in the substrate processing apparatus 1 includes a chemical liquid, a rinsing liquid, an organic solvent, a water repellent, etc. The chemical liquid supply unit 8, the rinsing liquid supply unit 9, the organic solvent supply unit 10, and the water repellent supply unit 11 are included in a processing liquid supply unit that supplies a processing liquid to the upper surface of the substrate W.

The processing liquid used in the substrate processing apparatus 1 is classified into a low-affinity processing liquid that is comparatively low in affinity for the inner peripheral surface 61a of the extension portion 61 of the facing member 6 and a high-affinity processing liquid that is comparatively high in affinity for the inner peripheral surface 61a of the extension portion 61.

Here, the term "affinity for the inner peripheral surface 61a of the extension portion 61" denotes wettability for the inner peripheral surface 61a of the extension portion 61. A processing liquid that is high in affinity for the inner peripheral surface 61a of the extension portion 61 is a processing liquid that is wettable for the inner peripheral surface 61a of the extension portion 61 (i.e., is high in wettability). A processing liquid that is low in affinity for the inner peripheral surface 61a of the extension portion 61 is a processing liquid that is less wettable for the inner peripheral surface 61a of the extension portion 61 (i.e., is low in wettability). It becomes easier for the processing liquid to adhere to the inner peripheral surface 61a of the extension portion 61 in proportion to an increase in the affinity of the processing liquid for the inner peripheral surface 61a of the extension portion 61. It becomes more difficult for the processing liquid to adhere to the inner peripheral surface 61a of the extension portion 61 in proportion to a decrease in the affinity of the processing liquid for the inner peripheral surface 61a of the extension portion 61.

The inner peripheral surface 61a is a hydrophobic surface, and therefore a hydrophilic processing liquid can be mentioned as a low-affinity processing liquid, and a hydrophobic processing liquid can be mentioned as a high-affinity processing liquid. The term "hydrophilicity" denotes the property of being high in affinity for water. The term "hydrophobicity" denotes the property of being low in affinity for water. In general, the hydrophobic processing liquid has lipophilicity. The term "lipophilicity" denotes the property of being high in affinity for a lipid or for a nonpolar organic solvent. The low-affinity processing liquid is an aqueous solution or water. The high-affinity processing liquid is either a solution that uses an organic substance as a solvent or a liquid organic substance.

The chemical liquid supply unit 8, the rinsing liquid supply unit 9, the organic solvent supply unit 10, and the water repellent supply unit 11 are each classified into either a low-affinity processing liquid supply unit or a high-affinity processing liquid supply unit. The low-affinity processing liquid supply unit is a unit that supplies a low-affinity processing liquid to the upper surface of the substrate W. The high-affinity processing liquid supply unit is a unit that supplies a high-affinity processing liquid to the upper surface of the substrate W.

The chemical liquid supply unit 8 is a unit that supplies a chemical liquid to a central region of the upper surface of the substrate W. The central region of the upper surface of the substrate W is a region around a center of the upper surface of the substrate W including a crossing position between the upper surface of the substrate W and the rotational axis A1. The chemical liquid supply unit 8 includes a chemical liquid nozzle 30 that discharges a chemical liquid toward the central region of the upper surface of the substrate W, a chemical liquid supply pipe 31 joined to the chemical liquid nozzle 30, and a chemical liquid valve 32 interposed in the chemical liquid supply pipe 31. A chemical liquid, such as hydrofluoric acid (HF), is supplied from a chemical liquid supply source to the chemical liquid supply pipe 31. The chemical liquid valve 32 opens and closes a flow passage in the chemical liquid supply pipe 31.

The chemical liquid discharged from the chemical liquid nozzle 30 is not limited to hydrofluoric acid. The chemical liquid discharged from the chemical liquid nozzle 30 may be a liquid including at least one of sulfuric acid, acetic acid, nitric acid, hydrochloric acid, hydrofluoric acid, buffered hydrofluoric acid (BHF), diluted hydrofluoric acid (DHF), ammonia water, hydrogen peroxide water, organic alkali (e.g., TMAH:tetramethylammoniumhydroxide, etc.), surfactant, and corrosion inhibitor. SPM (sulfuric acid hydrogen peroxide water mixture), SC1 (ammonia hydrogen peroxide water mixture), SC2 (hydrochloric acid hydrogen peroxide water mixture), etc., can be mentioned as an example of a chemical liquid made by mixing those substances together.

The chemical liquid discharged from the chemical liquid nozzle 30 is an aqueous solution (hydrophilic processing liquid) except when it is an organic alkali. Therefore, the chemical liquid discharged from the chemical liquid nozzle 30 is a low-affinity processing liquid that is low in affinity for the inner peripheral surface 61a (hydrophobic surface) of the extension portion 61 except when it is an organic alkali. The chemical liquid supply unit 8 is classified into the low-affinity processing liquid supply unit except when the chemical liquid discharged from the chemical liquid nozzle 30 is an organic alkali.

The organic alkali is a hydrophobic processing liquid. Therefore, the chemical liquid discharged from the chemical liquid nozzle 30 is a high-affinity processing liquid that is high in affinity for the inner peripheral surface 61a of the extension portion 61 when it is an organic alkali. The chemical liquid supply unit 8 is classified into the high-affinity processing liquid supply unit when the chemical liquid discharged from the chemical liquid nozzle 30 is an organic alkali.

The rinsing liquid supply unit 9 is a unit that supplies a rinsing liquid to the central region of the upper surface of the substrate W. The rinsing liquid supply unit 9 includes a rinsing liquid nozzle 40 that discharges a rinsing liquid toward the central region of the upper surface of the substrate W, a rinsing liquid supply pipe 41 joined to the rinsing liquid nozzle 40, and a rinsing liquid valve 42 interposed in the rinsing liquid supply pipe 41. A rinsing liquid, such as DIW, is supplied from a rinsing liquid supply source to the rinsing liquid supply pipe 41. The rinsing liquid valve 42 opens and closes a flow passage in the rinsing liquid supply pipe 41.

The rinsing liquid discharged from the rinsing liquid nozzle 40 is not limited to DIW. The rinsing liquid discharged from the rinsing liquid nozzle 40 may be carbonated water, electrolyzed ion water, ozone water, ammonia water, hydrochloric acid water having a diluted concentration (e.g., about 10 ppm to 100 ppm), or reduced water (hydrogen water). The rinsing liquid contains water.

As thus described, the rinsing liquid discharged from the rinsing liquid nozzle 40 is an aqueous solution or water. Therefore, the rinsing liquid discharged from the rinsing liquid nozzle 40 is a hydrophilic processing liquid. Therefore, the rinsing liquid discharged from the rinsing liquid nozzle 40 is a low-affinity processing liquid that is low in affinity for the inner peripheral surface 61*a* (hydrophobic surface) of the extension portion 61. The rinsing liquid supply unit 9 is classified into the low-affinity processing liquid supply unit.

The organic solvent supply unit 10 is a unit that supplies an organic solvent to the central region of the upper surface of the substrate W. The organic solvent supply unit 10 includes an organic solvent nozzle 50 that discharges an organic solvent toward the central region of the upper surface of the substrate W, an organic solvent supply pipe 51 joined to the organic solvent nozzle 50, and an organic solvent valve 52 interposed in the organic solvent supply pipe 51. An organic solvent, such as IPA, is supplied from an organic solvent supply source to the organic solvent supply pipe 51. The organic solvent valve 52 opens and closes a flow passage in the organic solvent supply pipe 51.

The organic solvent discharged from the organic solvent nozzle 50 is not limited to IPA. The organic solvent discharged from the organic solvent nozzle 50 may be an organic solvent that excludes IPA and that does not chemically react with the upper surface of the substrate W and with a pattern (not shown) formed on the substrate W (i.e., an organic solvent that is low in reactivity). More specifically, the organic solvent discharged from the organic solvent nozzle 50 may be an organic solvent that includes at least one of IPA, HFE (hydrofluoroether), methanol, ethanol, acetone, and trans-1,2-dichloroethylene. The organic solvent discharged from the organic solvent nozzle 50 is a liquid organic substance, and hence is hydrophobic processing liquid. Therefore, the organic solvent discharged from the organic solvent nozzle 50 is a high-affinity processing liquid that is high in affinity for the inner peripheral surface 61*a* (hydrophobic surface) of the extension portion 61. Therefore, the organic solvent supply unit 10 is the high-affinity processing liquid supply unit.

The water repellent supply unit 11 is a unit that supplies a water repellent to the central region of the upper surface of the substrate W. The water repellent supply unit 11 includes a water repellent nozzle 80 that discharges a water repellent toward the central region of the upper surface of the substrate W, a water repellent supply pipe 81 joined to the water repellent nozzle 80, and a water repellent valve 82 interposed in the water repellent supply pipe 81. A water repellent is supplied from a water repellent supply source to the water repellent supply pipe 81. The water repellent valve 82 opens and closes a flow passage in the water repellent supply pipe 81.

For example, a silicon-based water repellent that hydrophobizes silicon itself and a compound that includes silicon and a metal-based water repellent that hydrophobizes a metal itself and a compound that includes a metal can be used as the water repellent discharged from the water repellent nozzle 80. The metal-based water repellent includes at least one of, for example, amine having a hydrophobic group and organic silicon compounds. The silicon-based water repellent is, for example, a silane coupling agent. The silane coupling agent includes at least one of, for example, HMDS (hexamethyldisilazane), TMS (tetramethylsilane), fluorinated alkylchlorosilane, alkyl disilazane, and non-chloro-based water repellents. The non-chloro-based water repellent includes at least one of, for example, dimethylsilyl dimethylamine, dimethylsilyl diethylamine, hexamethyldisilazane, tetramethyl disilazane, bis(dimethylamino)dimethylsilane, N,N-dimethylamino trimethylsilane, N-(trimethylsilyl)dimethylamine, and organosilane compounds.

As thus described, the water repellent discharged from the water repellent nozzle 80 is an organic substance, such as a silicon-based water repellent or a metal-based water repellent, and hence is a hydrophobic processing liquid. Therefore, the water repellent discharged from the water repellent nozzle 80 is a high-affinity processing liquid that is high in affinity for the inner peripheral surface 61*a* (hydrophobic surface) of the extension portion 61. Therefore, the water repellent supply unit 11 is the high-affinity processing liquid supply unit.

In the present preferred embodiment, the chemical liquid nozzle 30, the rinsing liquid nozzle 40, the organic solvent nozzle 50, and the water repellent nozzle 80 are commonly housed in a nozzle housing member 35. A lower end portion of the nozzle housing member 35 faces the central region of the upper surface of the substrate W.

The supporting member 7 includes a facing member support portion 70 that supports the facing member 6, a nozzle support portion 72 that is disposed above the facing member support portion 70 and that supports the nozzle housing member 35, and a wall portion 71 by which the facing member support portion 70 and the nozzle support portion 72 are connected together and that extends in the vertical direction. A space 75 is defined by the facing member support portion 70, the wall portion 71, and the nozzle support portion 72. The space 75 houses an upper end portion of the cylindrical portion 62 and the flange portion 63. The facing member support portion 70 forms a lower wall of the supporting member 7. The nozzle support portion 72 forms an upper wall of the supporting member 7. The nozzle housing member 35 is attached substantially to the center of the nozzle support portion 72. A front end of the nozzle housing member 35 is positioned below the nozzle support portion 72.

The facing member support portion 70 supports the facing member 6 (the flange portion 63 of the facing member 6) from below. A cylindrical portion through-hole 70*a* through which the cylindrical portion 62 is inserted is formed in a central portion of the facing member support portion 70. A positioning hole 63*a* that passes through the flange portion 63 in an up-down direction is formed in each of the flange portions 63. An engagement projection 70*b* that is capable of engaging with the positioning hole 63*a* of the flange portion 63 corresponding thereto is formed at the facing member support portion 70. The facing member is positioned with respect to the supporting member in the rotational direction S by allowing the engagement projection 70*b* corresponding to each of the positioning holes 63*a* to engage with the positioning hole 63*a*.

The supporting member raising/lowering unit 12 raises and lowers the facing member 6 together with the supporting member 7. The supporting member raising/lowering unit 12 functions as a facing member raising/lowering unit that raises and lowers the facing member 6. The supporting member raising/lowering unit 12 includes, for example, a ball screw mechanism (not shown) and an electric motor (not shown) that gives a driving force to the ball screw mechanism.

The supporting member raising/lowering unit 12 is capable of placing the supporting member 7 at a predetermined height position between an upper position and a lower position. The lower position is a position shown in FIG. 6A described later. In detail, the lower position is a position at which the supporting member 7 becomes closest to the upper surface of the substrate holding unit 24 in a movable range of the supporting member 7. The upper position is a position shown by a solid line in FIG. 2. In detail, the upper position is a position at which the supporting member 7 becomes farthest from the upper surface of the substrate holding unit 24 in the movable range of the supporting member 7.

The supporting member 7 hangs and supports the facing member 6 in a state of being placed at the upper position. In this state, the facing member 6 is apart upwardly from the substrate holding unit 24. The supporting member 7 is raised and lowered by the supporting member raising/lowering unit 12, and hence passes through an engagement position between the upper position and the lower position. The engagement position is a position shown by an alternate long and two short dashed line in FIG. 2. The engagement position is a height position of the supporting member 7 when the facing member 6 is supported by the supporting member 7 from below and when the facing member 6 and the substrate holding unit 24 engage with each other. When the supporting member 7 is placed at the lower position, the supporting member 7 is apart downwardly from the facing member 6 that is in a state of having engaged with the substrate holding unit 24.

The facing member 6 is raised and lowered together with the supporting member 7 when the supporting member 7 is raised and lowered between the upper position and the engagement position. The supporting member 7 is apart downwardly from the facing member 6 when the supporting member 7 is placed at a position between the engagement position and the lower position. The facing member 6 is maintained in a state of being engaged with the substrate holding unit 24 when the supporting member 7 is placed at a position between the engagement position and the lower position.

The processing cup 13 is disposed on a further radially outer side than the substrate W held by the spin chuck 5. The processing cup 13 includes an exhaust bucket 26, a plurality of cups 14 to 16 (a first cup 14, a second cup 15, and a third cup 16), a plurality of guards 17 to 19 (a first guard 17, a second guard 18, and a third guard 19), and a plurality of guard raising/lowering units 27 to 29 (a first guard raising/lowering unit 27, a second guard raising/lowering unit 28, and a third guard raising/lowering unit 29).

The exhaust bucket 26 surrounds the spin chuck 5. An exhaust pipe (not shown) through which air flowing into the chamber 4 (see FIG. 1) is discharged to the outside of the chamber 4 is connected to the exhaust bucket 26. The plurality of cups 14 to 16 and the plurality of guards 17 to 19 are disposed between the spin chuck 5 and the exhaust bucket 26. Each of the plurality of cups 14 to 16 surrounds the substrate W. Each of the plurality of guards 17 to 19 surrounds the substrate W.

Each of the guards 17 to 19 receives a processing liquid scattering to the radially outer side from the substrate W held by the spin chuck 5. The second guard 18 is disposed on a further radially outer side than the first guard 17. The third guard 19 is disposed on a further radially outer side than the second guard 18.

The first guard 17 includes a first cylindrical portion 17A that surrounds the spin chuck 5 at a further radially inner side than the exhaust bucket 26 and a first inclined portion 17B that extends from the first cylindrical portion 17A so as to proceed more upwardly in proportion to a progression toward the radially inner side.

The second guard 18 includes a second cylindrical portion 18A that surrounds the spin chuck 5 at a further radially inner side than the exhaust bucket 26 and at a further radially outer side than the first cylindrical portion 17A and a second inclined portion 18B that extends from the second cylindrical portion 18A so as to proceed more upwardly in proportion to a progression toward the radially inner side.

The third guard 19 includes a third cylindrical portion 19A that surrounds the spin chuck 5 at a further radially inner side than the exhaust bucket 26 and at a further radially outer side than the second cylindrical portion 18A and a third inclined portion 19B that extends from the third cylindrical portion 19A so as to proceed more upwardly in proportion to a progression toward the radially inner side.

The first inclined portion 17B faces the second inclined portion 18B from below. The second inclined portion 18B faces the third inclined portion 19B from below.

Each of the cups 14 to 16 has an annular groove that is upwardly open. The second cup 15 is disposed on a further radially outer side than the first cup 14. The third cup 16 is disposed on a further radially outer side than the second cup 15. The third cup 16 is provided integrally with the second guard 18. A collection piping (not shown) or a discharge piping (not shown) is connected to a groove of each of the cups 14 to 16. A processing liquid received by each of the guards 17 to 19 corresponding to each of the cups 14 to 16 is guided to a bottom portion of each of the cups 14 to 16. The processing liquid guided to the bottom portion of each of the cups 14 to 16 is collected or discarded through the collection piping or the discharge piping.

The plurality of guard raising/lowering units 27 to 29 drive the up-down movement of the plurality of guards 17 to 19, respectively. Each of the guard raising/lowering units 27 to 29 includes, for example, a ball screw mechanism (not shown) and an electric motor (not shown) that gives a driving force to this mechanism.

Next, the height position of each of the guards 17 to 19 will be described in detail.

Figure 3A:
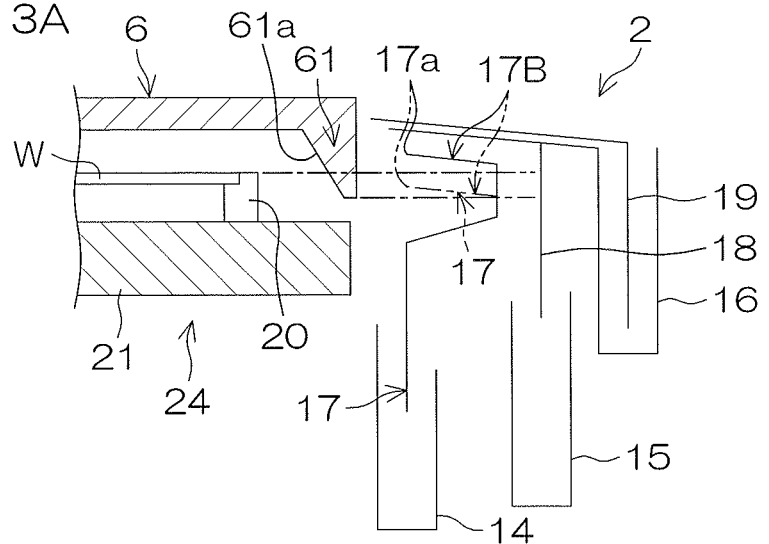
FIG. 3A is a schematic view to describe a height position of a first guard included in the processing unit.

FIG. 3A is a schematic view to describe the height position of the first guard 17. The first guard 17 is raised and lowered between an upper position and a lower position by means of the first guard raising/lowering unit 27 (see FIG. 2). The upper position is an upper limit position in the movable range of the first guard 17. The lower position is a lower limit position in the movable range of the first guard 17.

The first guard 17 is capable of being placed at a first liquid receiving position (position shown by a solid line in FIG. 3A) between the upper position and the lower position and at a second liquid receiving position (position shown by an alternate long and two short dashed line in FIG. 3A). In the first guard 17 placed at the second liquid receiving position, only the first inclined portion 17B is shown, and other portions in the first guard 17 are not shown.

The second liquid receiving position is a position lower than the first liquid receiving position. When the first guard 17 is placed at the first liquid receiving position, an upper end (radially inner side end 17a) of the first inclined portion 17B of the first guard 17 is placed at a position higher than the upper surface of the substrate W. When the first guard 17 is placed at the second liquid receiving position, the radially inner side end 17a is placed at a position lower than the upper surface of the substrate W and at a position higher than a lower end portion of the extension portion 61 of the facing member 6 in a state of being engaged with the substrate holding unit 24.

The scattering direction of a processing liquid from the extension portion 61 depends on whether the processing liquid is a low-affinity processing liquid or a high-affinity processing liquid, which will be described later in detail. The scattering direction D1 of the low-affinity processing liquid (see FIG. 7A described later) is inclined more upwardly than the scattering direction D2 of the high-affinity processing liquid (see FIG. 7B described later). Therefore, when the low-affinity processing liquid is scattered from the substrate W, the first guard 17 is disposed at the first liquid receiving position. When the high-affinity processing liquid is scattered from the substrate W, the first guard 17 is disposed at the second liquid receiving position.

Figure 3B:
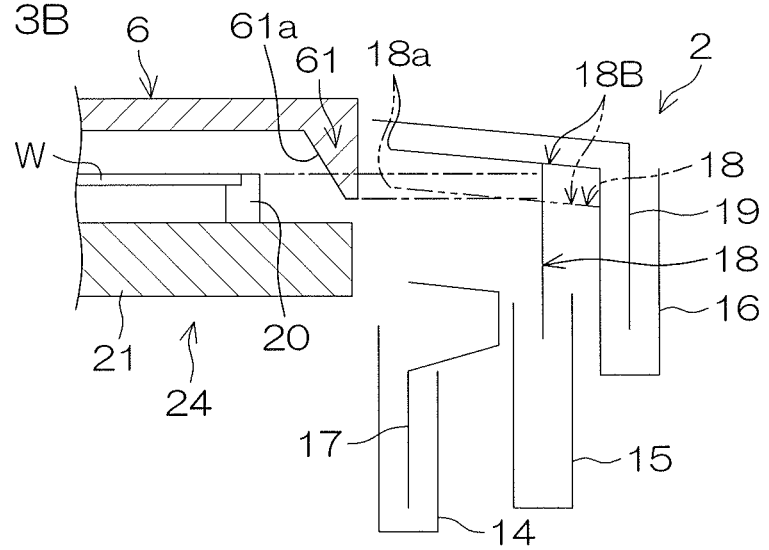
FIG. 3B is a schematic view to describe a height position of a second guard included in the processing unit.

FIG. 3B is a schematic view to describe the height position of the second guard 18. The second guard 18 is raised and lowered between an upper position and a lower position by means of the second guard raising/lowering unit 28 (see FIG. 2). The upper position is an upper limit position in the movable range of the second guard 18. The lower position is a lower limit position in the movable range of the second guard 18.

The second guard 18 is capable of being placed at a first liquid receiving position (position shown by a solid line in FIG. 3B) between the upper position and the lower position and at a second liquid receiving position (position shown by an alternate long and two short dashed line in FIG. 3B). In the second guard 18 placed at the second liquid receiving position, only the second inclined portion 18B is shown, and other portions in the second guard 18 and the second cup 15 are not shown.

The second liquid receiving position is a position lower than the first liquid receiving position. When the second guard 18 is placed at the first liquid receiving position, an upper end (radially inner side end 18a) of the second inclined portion 18B of the second guard 18 is placed at a position higher than the upper surface of the substrate W. When the second guard 18 is placed at the second liquid receiving position, the radially inner side end 18a is placed at a position lower than the upper surface of the substrate W and at a position higher than the lower end portion of the extension portion 61 of the facing member 6 in a state of being engaged with the substrate holding unit 24.

When the low-affinity processing liquid is scattered from the substrate W, the second guard 18 is disposed at the first liquid receiving position, and, when the high-affinity processing liquid is scattered from the substrate W, the second guard 18 is disposed at the second liquid receiving position in the same way as the first guard 17.

Figure 3C:
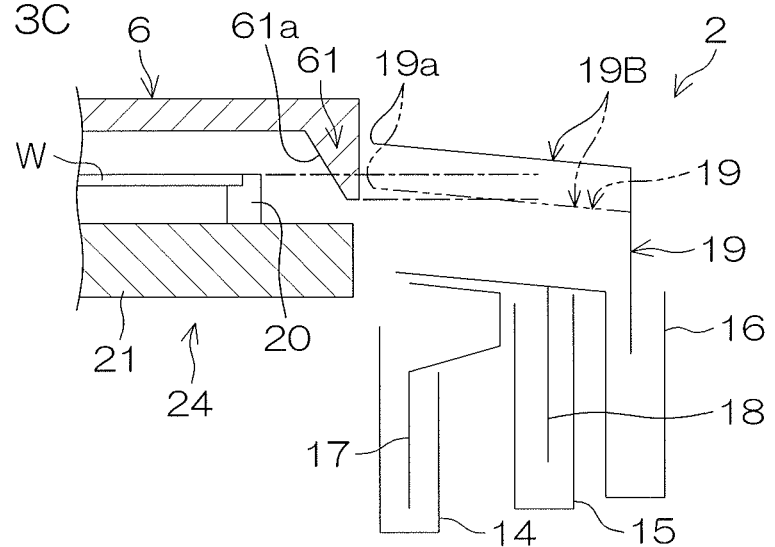
FIG. 3C is a schematic view to describe a height position of a third guard included in the processing unit.

FIG. 3C is a schematic view to describe the height position of the third guard 19. The third guard 19 is raised and lowered between an upper position and a lower position by means of the third guard raising/lowering unit 29 (see FIG. 2). The upper position is an upper limit position in the movable range of the third guard 19. The lower position is a lower limit position in the movable range of the third guard 19.

The third guard 19 is capable of being placed at a first liquid receiving position (position shown by a solid line in FIG. 3C) between the upper position and the lower position and at a second liquid receiving position (position shown by an alternate long and two short dashed line in FIG. 3C). In the third guard 19 placed at the second liquid receiving position, only the third inclined portion 19B is shown, and other portions in the third guard 19 are not shown.

The second liquid receiving position is a position lower than the first liquid receiving position. When the third guard 19 is placed at the first liquid receiving position, an upper end (radially inner side end 19a) of the third inclined portion 19B of the third guard 19 is placed at a position higher than the upper surface of the substrate W. When the third guard 19 is placed at the second liquid receiving position, the radially inner side end 19a is placed at a position lower than the upper surface of the substrate W and at a position higher than the lower end portion of the extension portion 61 of the facing member 6 in a state of being engaged with the substrate holding unit 24.

When the low-affinity processing liquid is scattered from the substrate W, the third guard 19 is disposed at the first liquid receiving position, and, when the high-affinity processing liquid is scattered from the substrate W, the third guard 19 is disposed at the second liquid receiving position in the same way as the first guard 17 and as the second guard 18.

Figure 4:
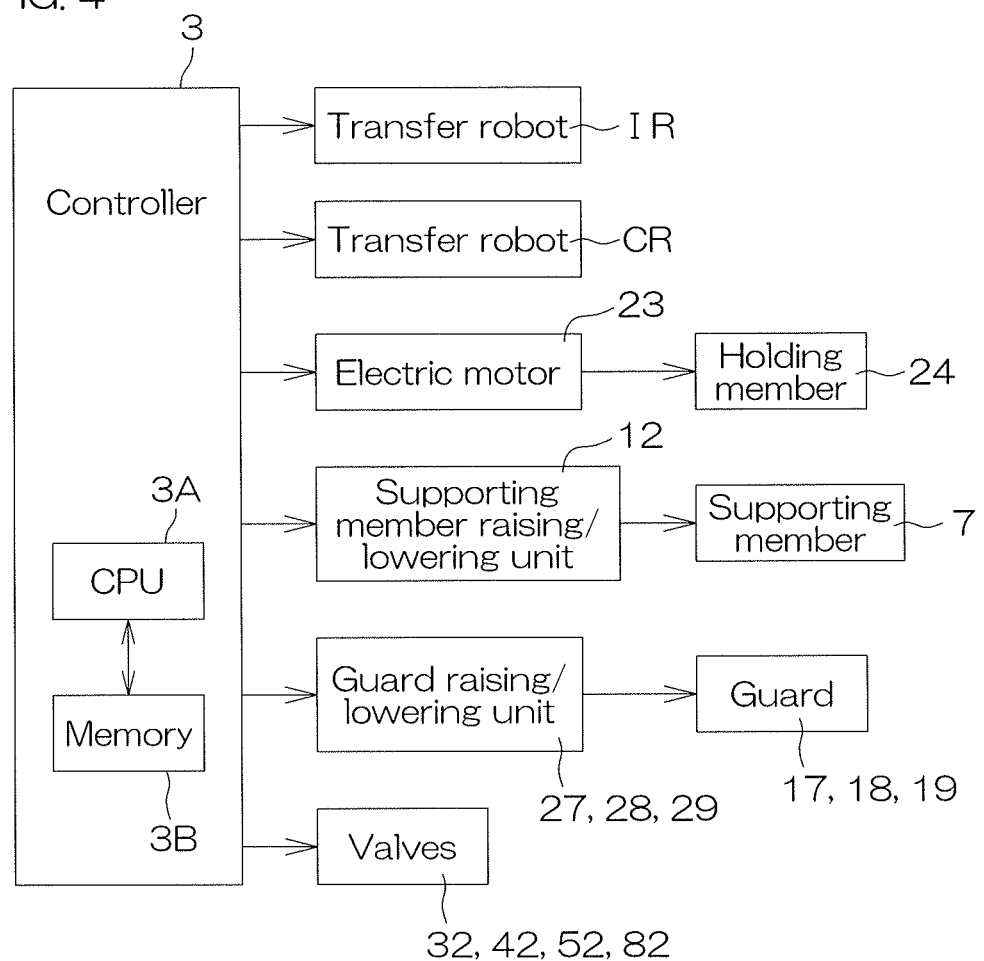
FIG. 4 is a block diagram to describe an electrical configuration of a main portion of the substrate processing apparatus.

FIG. 4 is a block diagram to describe an electrical configuration of a main portion of the substrate processing apparatus 1. The controller 3 is provided with a microcomputer, and controls to-be-controlled objects provided in the substrate processing apparatus 1 in accordance with a predetermined program. More specifically, the controller 3 includes a processor (CPU) 3A and a memory 3B in which the program is stored, and is configured to perform various control operations for substrate processing by allowing the processor 3A to execute the program. Particularly, the controller 3 controls operations of the transfer robots IR and CR, the electric motor 23, the supporting member raising/lowering unit 12, the guard raising/lowering units 27 to 29, the valves 32, 42, 52, 82, etc.

Figure 5:
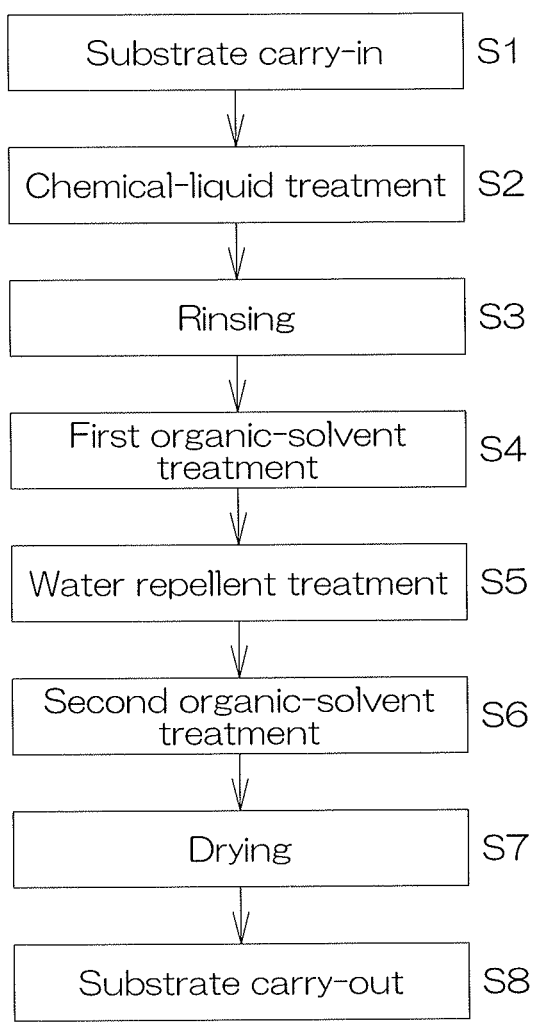
FIG. 5 is a flowchart to describe a first example of substrate processing performed by the substrate processing apparatus.

FIG. 5 is a flowchart to describe a first example of substrate processing performed by the substrate processing apparatus 1, and chiefly shows processing achieved by allowing the controller 3 to execute a program. FIG. 6A to FIG. 6E are illustrative cross-sectional views, each describing the first example of the substrate processing.

In the substrate processing performed by the substrate processing apparatus, substrate carry-in (S1), chemical-liquid treatment (S2), rinsing (S3), first organic-solvent treatment (S4), water repellent treatment (S5), second organic-solvent treatment (S6), drying (S7), and substrate carry-out (S8) are performed in this order as shown in, for example, FIG. 5.

First, before a substrate W is carried into the processing unit 2, a relative position in the rotational direction S between the facing member 6 and the substrate holding unit 24 is adjusted such that the facing member 6 and the substrate holding unit 24 can engage with each other. In detail, the electric motor 23 adjusts the position of the substrate holding unit 24 in the rotational direction S so that the first engagement portion 66 of the facing member 6 and the second engagement portion 76 of the substrate holding unit 24 overlap each other in a plan view.

Thereafter, referring also to FIG. 1, in the substrate processing performed by the substrate processing apparatus 1, the substrate W is carried into the processing unit 2 from the carrier C by means of the transfer robots IR and CR, and is delivered to the spin chuck 5 (Step S1: substrate carry-in). Thereafter, the substrate W is horizontally held by the chuck pin 20 with an interval upwardly from the upper surface of the spin base 21 until the substrate W is carried out by means of the transfer robot CR (substrate holding step).

Thereafter, the supporting member raising/lowering unit 12 lowers the supporting member 7 placed at the upper position toward the lower position. The supporting member 7 passes through the engagement position before moving to the lower position. When the supporting member 7 reaches the engagement position, the facing member 6 and the substrate holding unit 24 engage with each other by means of a magnetic force. Hence, the facing member 6 is supported from below by means of the substrate holding unit 24 whose height position is fixed. When the facing member 6 engages with the substrate holding unit 24, the extension portion 61 of the facing member 6 faces the substrate W from the radially outer side. Additionally, when the facing member 6 engages with the substrate holding unit 24, the extension portion 61 faces the spin base 21 from above. A small gap is provided between the lower end portion of the extension portion 61 and the upper surface of the spin base 21. As thus described, the facing member 6 is placed at a position at which the inner peripheral surface of the extension portion 61 faces the substrate W from the radially outer side by means of the supporting member raising/lowering unit 12 (facing member placing step).

When the supporting member 7 is further lowered from the engagement position, the facing member 6 is released from the support of the supporting member 7. In detail, the facing member support portion 70 of the supporting member 7 recedes downwardly from the flange portion 63 of the facing member 6.

Thereafter, the supporting member 7 reaches the lower position as shown in FIG. 6A. Thereafter, the electric motor 23 starts rotating the spin base 21 of the substrate holding unit 24. Hence, the substrate W that has been horizontally held rotates (substrate rotating step). The first engagement portion 66 disposed at the facing member 6 engages with the second engagement portion 76 disposed at the spin base 21. Therefore, the facing member 6 rotates synchronously with the substrate W (facing member rotating step). The synchronous rotation denotes rotating at the same rotational speed in the same direction.

Thereafter, the chemical-liquid treatment (S2) is started. In the chemical-liquid treatment (S2), hydrofluoric acid (HF) is supplied onto the substrate W as a chemical liquid, and hence treatment, such as etching, is applied to the upper surface of the substrate W.

In detail, referring to FIG. 6A, the third guard raising/lowering unit 29 places the third guard 19 at the upper position, and the second guard raising/lowering unit 28 places the second guard 18 at the upper position. Also, the first guard raising/lowering unit 27 places the first guard 17 at a height position, at which the guard 17 is able to receive a processing liquid, in accordance with the affinity of the processing liquid for the inner peripheral surface 61a of the extension portion 61 of the facing member 6 (guard placing step).

Thereafter, the chemical liquid valve 32 is opened. Hence, a chemical liquid (hydrofluoric acid that is a low-affinity processing liquid) is supplied from the chemical liquid nozzle 30 of the chemical liquid supply unit 8 (low-affinity processing liquid supply unit) to the central region of the upper surface of the substrate W being in a rotated state (low-affinity processing liquid supplying step). The chemical liquid spreads on the entirety of the upper surface of the substrate W by means of a centrifugal force.

The chemical liquid is scattered from the substrate W to the radially outer side by means of a centrifugal force. The chemical liquid that has been scattered from the substrate W to the radially outer side adheres to the inner peripheral surface 61a of the extension portion 61 of the facing member 6 that faces the substrate W from the radially outer side. The facing member 6 is rotating together with the substrate W, and therefore the chemical liquid that has adhered to the inner peripheral surface 61a of the extension portion 61 is scattered to a further radially outer side than the extension portion 61 by means of a centrifugal force. The chemical liquid that has been scattered to a further radially outer side than the extension portion 61 is received by the first guard 17. The chemical liquid received by the first guard 17 proceeds along the first cylindrical portion 17A, and is guided to the first cup 14.

Here, the scattering direction of a processing liquid from the extension portion 61 will be described. As described above, the scattering direction of a processing liquid from the extension portion 61 depends on whether the processing liquid is a low-affinity processing liquid or a high-affinity processing liquid. In detail, the low-affinity processing liquid is less wettable for the inner peripheral surface 61a of the extension portion 61 of the facing member 6. Therefore, the low-affinity processing liquid comparatively easily recedes from the inner peripheral surface 61a. Therefore, when the low-affinity processing liquid that has been scattered from the substrate W adheres to the inner peripheral surface of the extension portion 61 of the facing member 6, the low-affinity processing liquid is scattered to the radially outer side in a state of comparatively small liquid droplets by means of a centrifugal force before gathering on the surface of the facing member 6 and becoming large liquid droplets as shown in FIG. 7A.

On the other hand, the high-affinity processing liquid is wettable for the peripheral surface 61a of the extension portion 61. Therefore, once the high-affinity processing liquid adheres to the inner peripheral surface 61a of the extension portion 61 of the facing member 6, the high-affinity processing liquid does not easily recede from the inner peripheral surface 61a. Therefore, as shown in FIG. 7B, the high-affinity processing liquid forms comparatively large liquid droplets in a state of having adhered to the surface of the facing member 6 before being scattered to the radially outer side by means of a centrifugal force.

The liquid droplet receives its own weight, and hence the larger its size, more easily falls downwardly from the inner peripheral surface 61a of the extension portion 61. Therefore, the scattering direction D2 of the high-affinity processing liquid is inclined more downwardly than the scattering direction D1 of the low-affinity processing liquid. For simplification, reference signs 17 to 19 are given to the single guard in FIG. 7A and FIG. 7B, and yet, actually, the guards 17 to 19 are placed at mutually different positions, respectively.

In the chemical-liquid treatment (S2), hydrofluoric acid is used as a processing liquid, and therefore a processing liquid received by the first guard 17 is a low-affinity processing liquid in the chemical-liquid treatment (S2). Therefore, in the guard placing step of the chemical-liquid treatment (S2), the first guard 17 is placed at the first liquid receiving position (first placing step, low-affinity-processing-liquid-guard placing step). As thus described, in the chemical-liquid treatment (S2), the first guard 17 functions as a guard for a low-affinity processing liquid that receives a low-affinity processing liquid. The first guard raising/lowering unit 27 functions as a guard raising/lowering unit for a low-affinity processing liquid.

In the chemical-liquid treatment (S2), the rotational speed of the substrate W can be changed between 300 rpm and 1200 rpm. Here, a centrifugal force that acts on a processing liquid being scattered from the substrate W becomes greater as the rotational speed of the substrate W becomes higher. Therefore, the scattering direction of a processing liquid from the substrate W is inclined more upwardly as the rotational speed of the substrate W becomes higher.

Therefore, in the first placing step of the chemical-liquid treatment (S2), the position of the first guard 17 is adjusted so that the first guard 17 is placed more upwardly as the rotational speed of the substrate W is higher. In other words, in the chemical-liquid treatment (S2), the first liquid receiving position of the first guard 17 is adjusted (is set) more upwardly as the rotational speed of the substrate W is higher. Therefore, it is possible to place the first guard 17 at a more appropriate position to receive a chemical liquid.

The rinsing (S3) is performed after completing the chemical-liquid treatment (S2) that has been performed for a fixed period of time. In the rinsing, hydrofluoric acid (chemical liquid) on the substrate W is replaced by DIW serving as a rinsing liquid, and, as a result, the upper surface of the substrate W is rinsed.

In detail, the chemical liquid valve 32 is closed. Hence, discharge of the hydrofluoric acid from the chemical liquid nozzle 30 is stopped. Referring to FIG. 6B, the third guard raising/lowering unit 29 maintains the third guard 19 at the upper position, and the second guard raising/lowering unit 28 maintains the second guard 18 at the upper position. Also, the first guard 17 is placed at a height position, at which the first guard 17 is able to receive a processing liquid, by means of the first guard raising/lowering unit 27, in accordance with the affinity of the processing liquid for the inner peripheral surface 61a of the extension portion 61 of the facing member 6 (guard placing step).

Thereafter, the rinsing liquid valve 42 is opened. Hence, a rinsing liquid is supplied toward the central region of the upper surface of the substrate W being in a rotated state from the rinsing liquid nozzle 40 of the rinsing liquid supply unit 9 (low-affinity processing liquid supply unit) (low-affinity processing liquid supplying step). The rinsing liquid spreads on the entirety of the upper surface of the substrate W by means of a centrifugal force. Hence, the chemical liquid on the substrate W is replaced by the rinsing liquid.

Either a mixture consisting of the chemical liquid and the rinsing liquid or the rinsing liquid on the substrate W is scattered from the substrate W to the radially outer side by means of a centrifugal force. Either the mixture consisting of the chemical liquid and the rinsing liquid or the rinsing liquid that has been scattered from the substrate W to the radially outer side adheres to the inner peripheral surface 61a of the extension portion 61 of the facing member 6 that faces the substrate W from the radially outer side.

The facing member 6 is rotating together with the substrate W, and therefore either the mixture consisting of the chemical liquid and the rinsing liquid or the rinsing liquid that has adhered to the inner peripheral surface 61a of the extension portion 61 is scattered to a further radially outer side than the extension portion 61 by means of a centrifugal force. Either the mixture consisting of the chemical liquid and the rinsing liquid or the rinsing liquid that has been scattered to a further radially outer side than the extension portion 61 is received by the first guard 17. Either the mixture consisting of the chemical liquid and the rinsing liquid or the rinsing liquid received by the first guard 17 proceeds along the first cylindrical portion 17A, and is guided to the first cup 14.

The processing liquid received by the first guard 17 in the rinsing (S3) is chiefly DIW. In other words, the processing liquid received by the first guard 17 in the rinsing (S3) is chiefly a low-affinity processing liquid. Therefore, in the guard placing step of the rinsing (S3), the first guard 17 is placed at the first liquid receiving position (first placing step, low-affinity-processing-liquid-guard placing step).

As thus described, in the rinsing (S3), the first guard 17 functions as a guard for a low-affinity processing liquid that receives a low-affinity processing liquid. Additionally, the first guard raising/lowering unit 27 functions as a guard raising/lowering unit for a low-affinity processing liquid.

In the rinsing (S3), the rotational speed of the substrate W can be changed between 50 rpm and 1000 rpm. In the first placing step in the rinsing (S3), the position of the first guard 17 is adjusted such that the first guard 17 is placed more upwardly as the rotational speed of the substrate W is higher. In other words, in the rinsing (S3), the first liquid receiving position of the first guard 17 is adjusted (is set) more upwardly as the rotational speed of the substrate W is higher. Therefore, it is possible to place the first guard 17 at a more appropriate position to receive a rinsing liquid.

The first organic-solvent treatment (S4) is performed after completing the rinsing (S3) that has been performed for a fixed period of time. In the first organic-solvent treatment (S4), the rinsing liquid on the substrate W is replaced by an organic solvent such as IPA.

In detail, the rinsing liquid valve 42 is closed. Hence, the rinsing liquid stops being discharged from the rinsing liquid nozzle 40. Thereafter, referring to FIG. 6C, the first guard raising/lowering unit 27 places the first guard 17 at the lower position. The second guard raising/lowering unit 28 places the second guard 18 at the lower position. The third guard 19 is placed at a height position, at which the third guard 19 is able to receive a processing liquid by means of the third guard raising/lowering unit 29, in accordance with the affinity of the processing liquid for the inner peripheral surface 61a of the extension portion 61 of the facing member 6 (guard placing step).

Thereafter, the organic solvent valve 52 is opened. Hence, an organic solvent is supplied toward the central region of the upper surface of the substrate W being in a rotated state from the organic solvent nozzle 50 of the organic solvent supply unit 10 (high-affinity processing liquid supply unit) (processing-liquid supplying step, high-affinity processing liquid supplying step). The organic solvent spreads on the entirety of the upper surface of the substrate W by means of a centrifugal force. Hence, the rinsing liquid on the substrate W is replaced by the organic solvent.

Either a mixture consisting of the rinsing liquid and the organic solvent or the organic solvent on the substrate W is scattered from the substrate W to the radially outer side by means of a centrifugal force. Either the mixture consisting of the rinsing liquid and the organic solvent or the organic solvent that has been scattered from the substrate W to the radially outer side adheres to the inner peripheral surface 61a of the extension portion 61 of the facing member 6 that faces the substrate W from the radially outer side.

The facing member 6 is rotating together with the substrate W, and therefore either the mixture consisting of the rinsing liquid and the organic solvent or the organic solvent that has adhered to the inner peripheral surface 61a of the extension portion 61 is scattered to a further radially outer side than the extension portion 61 by means of a centrifugal force. Either the mixture consisting of the rinsing liquid and the organic solvent or the organic solvent that has been scattered to a further radially outer side than the extension portion 61 is received by the third guard 19. Either the mixture consisting of the rinsing liquid and the organic solvent or the organic solvent received by the third guard 19 proceeds along the third cylindrical portion 19A, and is guided to the third cup 16.

The processing liquid received by the third guard 19 in the first organic-solvent treatment (S4) is chiefly IPA. In other words, the processing liquid received by the third guard 19 in the first organic-solvent treatment (S4) is chiefly a high-affinity processing liquid. Therefore, in the guard placing step of the first organic-solvent treatment (S4), the third guard 19 is placed at the second liquid receiving position (second placing step, high-affinity-processing-liquid-guard placing step). As thus described, in the first organic-solvent treatment (S4), the third guard 19 functions as a guard for a high-affinity processing liquid that receives a high-affinity processing liquid. Additionally, the third guard raising/lowering unit 29 functions as a guard raising/lowering unit for a high-affinity processing liquid. In the first organic-solvent treatment (S4), the rotational speed of the substrate W can be changed between 50 rpm and 1000 rpm. In the second placing step in the first organic-solvent treatment (S4), the position of the third guard 19 is adjusted such that the third guard 19 is placed more upwardly, as the rotational speed of the substrate W is higher. In other words, in the first organic-solvent treatment (S4), the second liquid receiving position of the third guard 19 is adjusted (is set) more upwardly, as the rotational speed of the substrate W is higher. Therefore, it is possible to place the third guard 19 at a more appropriate position to receive an organic solvent.

The water repellent treatment (S5) is performed after completing the first organic-solvent treatment (S4) that has been performed for a fixed period of time. In the water repellent treatment (S5), the organic solvent on the substrate W is replaced by a water repellent.

In detail, the organic solvent valve 52 is closed. Hence, discharge of the organic solvent from the organic solvent nozzle 50 is stopped. Thereafter, referring to FIG. 6D, the first guard raising/lowering unit 27 places the first guard 17 at the lower position. The third guard raising/lowering unit 29 places the third guard 19 at the upper position. The second guard 18 is placed at a height position, at which the second guard 18 is able to receive a processing liquid, by means of the second guard raising/lowering unit 28, in accordance with the affinity of the processing liquid for the inner peripheral surface 61a of the extension portion 61 of the facing member 6 (guard placing step).

Thereafter, the water repellent valve 82 is opened. Hence, a water repellent is supplied toward the central region of the upper surface of the substrate W being in a rotated state from the water repellent nozzle 80 of the water repellent supply unit 11 (high-affinity processing liquid supply unit) (processing-liquid supplying step, high-affinity processing liquid supplying step). The water repellent spreads on the entirety of the upper surface of the substrate W by means of a centrifugal force. Hence, the organic solvent on the substrate W is replaced by the water repellent.

Either a mixture consisting of the organic solvent and the water repellent or the water repellent on the substrate W is scattered from the substrate W to the radially outer side by means of a centrifugal force. Either the mixture consisting of the organic solvent and the water repellent or the water repellent that has been scattered from the substrate W to the radially outer side adheres to the inner peripheral surface 61a of the extension portion 61 of the facing member 6 that faces the substrate W from the radially outer side.

The facing member 6 is rotating together with the substrate W, and therefore either the mixture consisting of the organic solvent and the water repellent or the water repellent that has adhered to the inner peripheral surface 61a of the extension portion 61 is scattered to a further radially outer side than the extension portion 61 by means of a centrifugal force. Either the mixture consisting of the organic solvent and the water repellent or the water repellent that has been scattered to a further radially outer side than the extension portion 61 is received by the second guard 18. Either the mixture consisting of the organic solvent and the water repellent or the water repellent received by the second guard 18 proceeds along the second cylindrical portion 18A, and is guided to the second cup 15.

The processing liquid received by the second guard 18 in the water repellent treatment (S5) is chiefly a water repellent. In other words, the processing liquid received by the second guard 18 in the water repellent treatment (S5) is chiefly a high-affinity processing liquid. Therefore, in the guard placing step of the water repellent treatment (S5), the second guard 18 is placed at the second liquid receiving position (second placing step, high-affinity-processing-liquid-guard placing step).

As thus described, in the water repellent treatment (S5), the second guard 18 functions as a guard for a high-affinity processing liquid. Additionally, the second guard raising/lowering unit 28 functions as a guard raising/lowering unit for a high-affinity processing liquid.

In the water repellent treatment (S5), the rotational speed of the substrate W can be changed between 50 rpm and 1000 rpm. In the guard placing step in the water repellent treatment (S5), the position of the second guard 18 is adjusted such that the second guard 18 is placed more upwardly as the rotational speed of the substrate W is higher. In other words, in the water repellent treatment (S5), the second liquid receiving position of the second guard 18 is adjusted (is set) more upwardly as the rotational speed of the substrate W is higher. Therefore, it is possible to place the second guard 18 at a more appropriate position to receive a water repellent.

The second organic-solvent treatment (S6) is performed after completing the water repellent treatment (S5) that has been performed for a fixed period of time. In the second organic-solvent treatment, the water repellent on the substrate W is replaced by an organic solvent.

In detail, the water repellent valve 82 is closed. Also, referring to FIG. 6E, the first guard raising/lowering unit 27 places the first guard 17 at the lower position. Also, the second guard raising/lowering unit 28 places the second guard 18 at the lower position. The third guard 19 is placed at a height position, at which the third guard 19 able to receive a processing liquid, by means of the third guard raising/lowering unit 29, in accordance with the affinity of the processing liquid for the inner peripheral surface 61a of the extension portion 61 of the facing member 6 (guard placing step).

Thereafter, the organic solvent valve 52 is opened. Hence, an organic solvent is discharged from the organic solvent nozzle 50 toward the central region of the upper surface of the substrate W being in a rotated state. The organic solvent spreads on the entirety of the upper surface of the substrate W by means of a centrifugal force. Hence, the water repellent on the substrate W is replaced by the organic solvent.

Either a mixture consisting of the organic solvent and the water repellent or the organic solvent on the substrate W is scattered from the substrate W to the radially outer side by means of a centrifugal force. Either the mixture consisting of the organic solvent and the water repellent or the organic solvent that has been scattered from the substrate W to the radially outer side adheres to the inner peripheral surface of the extension portion 61 of the facing member 6 that faces the substrate W from the radially outer side.

The facing member 6 is rotating together with the substrate W, and therefore either the mixture consisting of the organic solvent and the water repellent or the organic solvent that has adhered to the inner peripheral surface of the extension portion 61 is scattered to a further radially outer side than the extension portion 61 by means of a centrifugal force. Either the mixture consisting of the organic solvent and the water repellent or the organic solvent that has been scattered to a further radially outer side than the extension portion 61 is received by the third guard 19. Either the mixture consisting of the organic solvent and the water repellent or the organic solvent received by the third guard 19 proceeds along the third cylindrical portion 19A, and is guided to the third cup 16.

The processing liquid received by the third guard 19 in the second organic-solvent treatment (S6) is chiefly IPA. In other words, the processing liquid received by the third guard 19 in the second organic-solvent treatment (S6) is chiefly a high-affinity processing liquid. Therefore, in the guard placing step of the second organic-solvent treatment (S6), the third guard 19 is placed at the second liquid receiving position (second placing step, high-affinity-processing-liquid-guard placing step).

As thus described, in the second organic-solvent treatment (S6), the third guard 19 functions as a guard for a high-affinity processing liquid. Additionally, the third guard raising/lowering unit 29 functions as a guard raising/lowering unit for a high-affinity processing liquid.

In the second organic-solvent treatment (S6), the rotational speed of the substrate W can be changed between 50 rpm and 1000 rpm. In the guard placing step in the second organic-solvent treatment (S6), the position of the third guard 19 is adjusted such that the third guard 19 is placed more upwardly as the rotational speed of the substrate W is higher. In other words, in the second organic-solvent treatment (S6), the second liquid receiving position of the third guard 19 is adjusted (is set) more upwardly as the rotational speed of the substrate W is higher. Therefore, it is possible to place the third guard 19 at a more appropriate position to receive an organic solvent.

The drying (S7) in which liquid components on the upper surface of the substrate W are shaken off by means of a centrifugal force is performed after completing the second organic-solvent treatment (S6) that has been performed for a fixed period of time. In detail, the organic solvent valve 52 is closed, and then the substrate W is rotated at a high speed (e.g., 2000 rpm). Thereafter, the electric motor 23 stops the rotation of the substrate W.

Thereafter, the transfer robot CR enters the processing unit 2, and then scoops out an already-processed substrate W from the spin chuck 5, and carries out the substrate W from the processing unit 2 (Step S8: substrate carry-out). The substrate W is delivered from the transfer robot CR to the transfer robot IR, and is stored in the carrier C by means of the transfer robot IR.

According to the present preferred embodiment, the substrate processing apparatus 1 includes the substrate holding unit 24, the electric motor 23 (the substrate rotating unit, the facing-member rotating unit), the chemical liquid supply unit 8, the rinsing liquid supply unit 9, the organic solvent supply unit 10, the water repellent supply unit 11 (the processing liquid supply units), the guards 17 to 19, the guard raising/lowering units 27 to 29, the facing member 6, the supporting member raising/lowering unit 12 (the facing member raising/lowering unit), and the controller 3.

A substrate W that has been horizontally held is rotated around the rotational axis A1 by means of the electric motor 23. The facing member 6 is rotated around the rotational axis A1. A processing liquid (chemical liquid, rinsing liquid, organic solvent, and water repellent) is supplied to the upper surface of the substrate W being in a rotated state from the chemical liquid supply unit 8, the rinsing liquid supply unit 9, the organic solvent supply unit 10, and the water repellent supply unit 11. The guards 17 to 19 are respectively placed at height positions that enable the reception of a processing liquid that is scattered from the upper surface of the substrate W toward the radially outer side by means of the guard raising/lowering units 27 to 29, in accordance with the affinity of the processing liquid for the inner peripheral surface 61a of the extension portion 61 of the facing member 6.

According to this configuration, the processing liquid that is scattered from the upper surface of the substrate W to the outer side in the radial direction is once received by the inner peripheral surface 61a of the extension portion 61 of the facing member 6, and is then scattered from the extension portion 61 to the outer side in the radial direction, and, as a result, is received by the guards 17 to 19. Each of the plurality of guards 17 to 19 is placed at an appropriate height position in accordance with the affinity of the processing liquid for the inner peripheral surface 61a of the extension portion 61. Therefore, it is possible to excellently receive the processing liquid by means of the plurality of guards 17 to 19 regardless of the kind (affinity for the inner peripheral surface 61a of the extension portion 61) of the processing liquid supplied to the substrate W.

According to the present preferred embodiment, in the guard placing step, the first placing step in which the first guard 17 is placed at the first liquid receiving position by means of the guard raising/lowering unit 27 is performed when the first guard 17 receives a low-affinity processing liquid. Additionally, in the guard placing step, the second placing step in which the second guard 18 is placed at the second liquid receiving position by means of the second guard raising/lowering unit 28 is performed when the second guard 18 receives a high-affinity processing liquid. Additionally, in the guard placing step, the second placing step in which the third guard 19 is placed at the second liquid receiving position by means of the third guard raising/lowering unit 29 is performed when the third guard 19 receives a high-affinity processing liquid.

Each of the guards 17 to 19 is placed at an appropriate position by setting the second liquid receiving position (the position of the second guard 18 and the position of the third guard 19 when a high-affinity processing liquid is received) lower than the first liquid receiving position (the position of the first guard 17 when a low-affinity processing liquid is received). Therefore, a processing liquid is excellently received by the plurality of guards 17 to 19 regardless of the kind of the processing liquid.

Preferably, the first guard 17 is placed such that the upper end of the first guard 17 is placed at a position higher than the upper surface of the substrate W when the first guard 17 is placed at the first liquid receiving position. Additionally, preferably, the second guard 18 is placed such that the upper end of the second guard 18 is placed at a position lower than the upper surface of the substrate W and at a position higher than the lower end portion of the extension portion 61 when the second guard 18 is placed at the second liquid receiving position. Additionally, preferably, the third guard 19 is placed such that the upper end of the third guard 19 is placed at a position lower than the upper surface of the substrate W and at a position higher than the lower end portion of the extension portion 61 when the third guard 19 is placed at the second liquid receiving position. If so, a processing liquid is more excellently received by the guards 17 to 19.

Additionally, according to the present preferred embodiment, a low-affinity processing liquid and a high-affinity processing liquid are respectively received by the different guards 17 to 19. In detail, a low-affinity processing liquid is received by the first guard 17 (guard for a low-affinity processing liquid), and a high-affinity processing liquid is received by the second guard 18 and the third guard 19 (guards for a high-affinity processing liquid). In other words, it is possible to place each of the plurality of guards 17 to 19 at an appropriate position (the first liquid receiving position or the second liquid receiving position) in accordance with the kind of a processing liquid. A processing liquid that is scattered from the substrate W is excellently received by the plurality of guards 17 to 19. The substrate processing performed by the substrate processing apparatus 1 according to the aforementioned preferred embodiment is not limited to the aforementioned examples. The substrate processing may be performed by the substrate processing apparatus 1 as in the following examples.

Figure 8A:
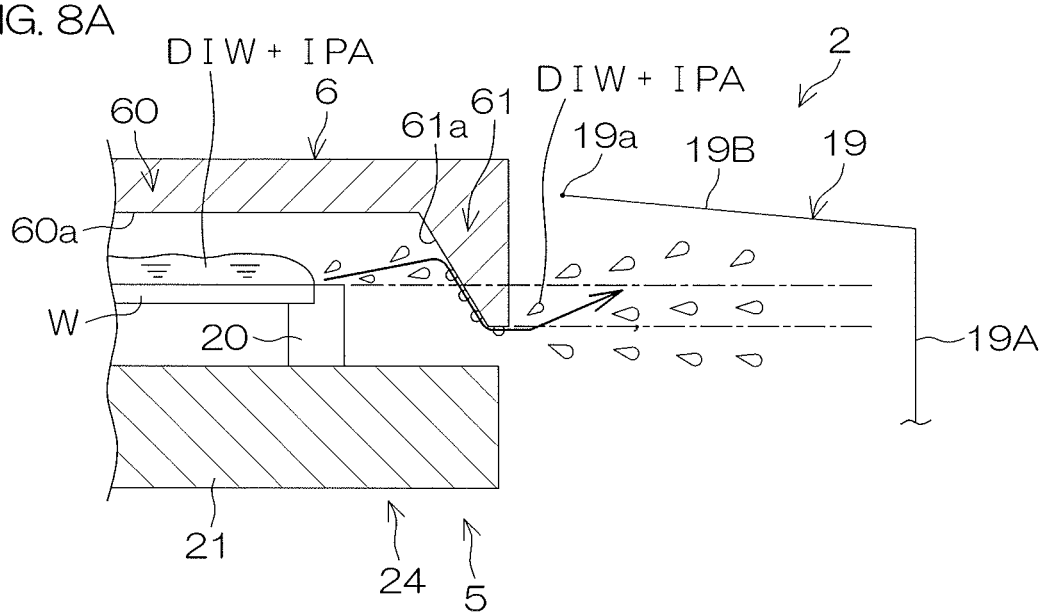
FIG. 8A is an illustrative cross-sectional view to describe a second example of the substrate processing.
Figure 8B:
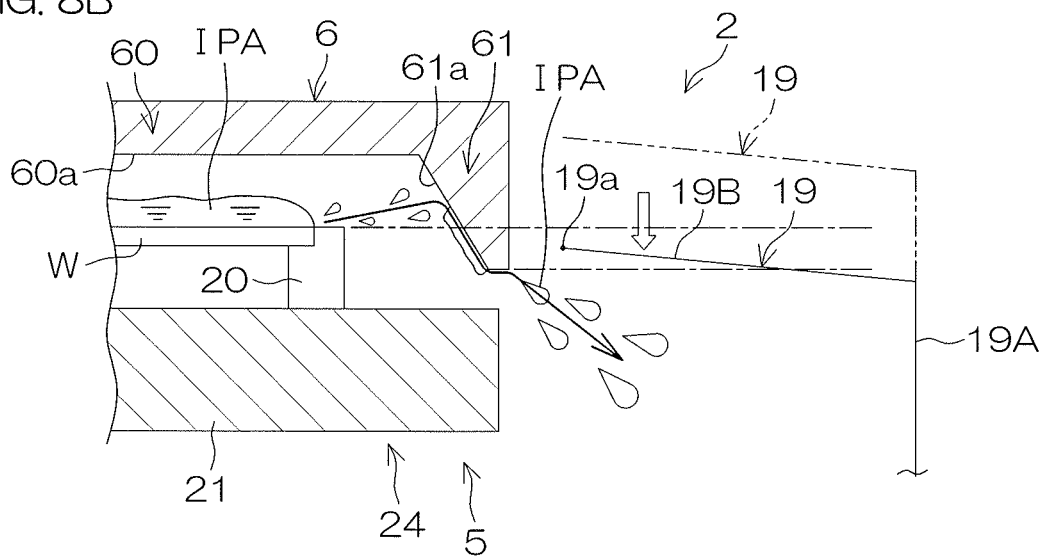
FIG. 8B is an illustrative cross-sectional view to describe the second example of the substrate processing.

FIG. 8A and FIG. 8B are illustrative cross-sectional views to describe a second example of the substrate processing performed by the substrate processing apparatus 1. In the first organic-solvent treatment (S4), DIW on the substrate W is replaced by IPA by supplying IPA to the upper surface of the substrate W in the same way as in the first example of the substrate processing. In other words, the high-affinity processing liquid supplying step (organic solvent supplying step) is performed after completing the low-affinity processing liquid supplying step (rinsing liquid supplying step), and, as a result, the low-affinity processing liquid (DIW) on the upper surface of the substrate W is replaced by the high-affinity processing liquid (IPA) (first replacing step).

Here, as shown in FIG. 8A, the liquid that is scattered from the substrate W is a mixture consisting of the low-affinity processing liquid and the high-affinity processing liquid in the first replacing step. In the first replacing step, the low-affinity processing liquid on the upper surface of the substrate W is replaced by the high-affinity processing liquid, and therefore the low-affinity processing liquid is contained in the liquid that is scattered from the substrate W immediately after the start of the first replacing step more than the high-affinity processing liquid. Thereafter, the ratio of the high-affinity processing liquid contained in the liquid scattered from the substrate W gradually becomes higher, and the liquid that is scattered from the substrate W after ending the first replacing step becomes only the high-affinity processing liquid as shown in FIG. 8B.

Therefore, unlike the aforementioned substrate processing, the height position of the third guard 19 may be changed in the first replacing step as follows. In detail, the third guard raising/lowering unit 29 may change the height position of the third guard 19 so that the third guard 19 is placed at the first liquid receiving position as shown in FIG. 8A when the first replacing step is started and so that the third guard 19 is placed at the second liquid receiving position as shown in FIG. 8B after the first replacing step is ended. Hence, the processing liquid is more excellently received by the third guard 19.

Preferably, the height position of the third guard 19 is set to be placed at the second liquid receiving position simultaneously with the end of the first replacing step. The height position of the third guard 19 may be changed immediately before the end of the first replacing step, or may be changed gradually during the first replacing step. The first replacing step is ended when the low-affinity processing liquid on the substrate W is completely replaced by the high-affinity processing liquid.

Figure 9A:
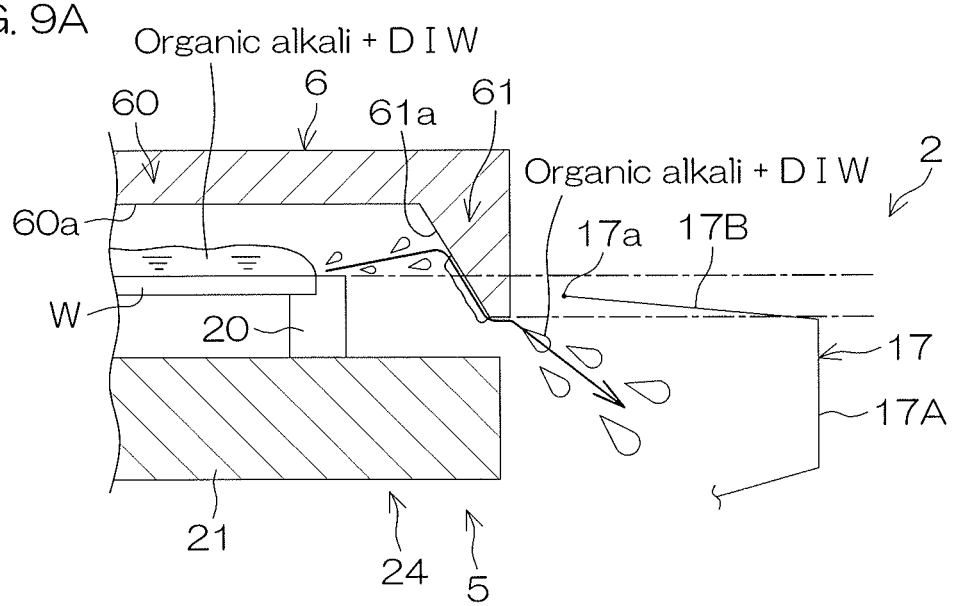
FIG. 9A is an illustrative cross-sectional view to describe a third example of the substrate processing.
Figure 9B:
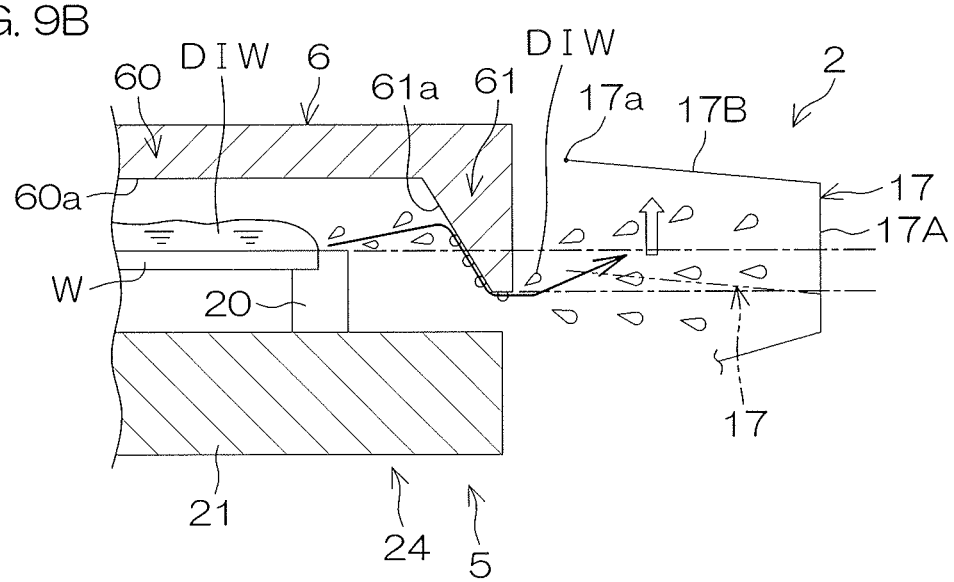
FIG. 9B is an illustrative cross-sectional view to describe the third example of the substrate processing.

FIG. 9A and FIG. 9B are illustrative cross-sectional views to describe a third example of the substrate processing performed by the substrate processing apparatus 1. In the third example of the substrate processing performed by the substrate processing apparatus 1, an organic alkali is used as the chemical liquid in the chemical-liquid treatment (S2) unlike the aforementioned substrate processing. In other words, the chemical liquid is a high-affinity processing liquid in the third example of the substrate processing.

In the rinsing (S3), the organic alkali (high-affinity processing liquid) on the substrate W is replaced by DIW (low-affinity processing liquid). In other words, the rinsing liquid supplying step (low-affinity processing liquid supplying step) is performed after completing the chemical liquid supplying step (high-affinity processing liquid supplying step), and, as a result, the high-affinity processing liquid (organic alkali) on the upper surface of the substrate W is replaced by the low-affinity processing liquid (DIW) (second replacing step).

Here, as shown in FIG. 9A, the liquid that is scattered from the substrate W is a mixture consisting of the low-affinity processing liquid and the high-affinity processing liquid in the second replacing step. In the second replacing step, the high-affinity processing liquid on the upper surface of the substrate W is replaced by the low-affinity processing liquid, and therefore the high-affinity processing liquid is contained in the liquid that is scattered from the substrate W immediately after the start of the second replacing step more than the low-affinity processing liquid. Thereafter, the ratio of the low-affinity processing liquid contained in the liquid scattered from the substrate W gradually becomes higher, and the liquid that is scattered from the substrate W after ending the second replacing step becomes only the low-affinity processing liquid as shown in FIG. 9B.

Therefore, unlike the aforementioned substrate processing, the height position of the first guard 17 may be changed in the second replacing step as follows. In detail, in the second replacing step, the first guard raising/lowering unit 27 may change the height position of the first guard 17 so that the first guard 17 is placed at the second liquid receiving position as shown in FIG. 9A when the second replacing step is started and so that the first guard 17 is placed at the first liquid receiving position as shown in FIG. 9B after the second replacing step is ended. Hence, the processing liquid is more excellently received by the first guard 17.

Preferably, the height position of the first guard 17 is set to be placed at the first liquid receiving position simultaneously with the end of the second replacing step. The height position of the first guard 17 may be changed immediately before the end of the second replacing step, or may be changed gradually during the second replacing step. The second replacing step is ended when the high-affinity processing liquid on the substrate W is completely replaced by the low-affinity processing liquid.

Additionally, in the aforementioned substrate processing, the first guard 17 is set to receive a chemical liquid and a rinsing liquid, and the third guard 19 is set to receive an organic solvent. Additionally, the second guard 18 is set to receive a water repellent. However, the chemical liquid, the rinsing liquid, the organic solvent, and the water repellent may be received by any of the guards 17 to 19.

For example, the second guard 18 may receive the chemical liquid and the rinsing liquid, and the first guard 17 may receive the organic solvent, and the third guard 19 may receive the water repellent. Additionally, the third guard 19 may receive the chemical liquid and the rinsing liquid, and the second guard 18 may receive the organic solvent, and the first guard 17 may receive the water repellent. In short, the first guard 17 may function as a guard for a high-affinity processing liquid, and the second guard 18 and the third guard 19 may function as guards for a low-affinity processing liquid.

The first guard 17 is placed at the second liquid receiving position when the first guard 17 functions as a guard for a high-affinity processing liquid (see FIG. 3A). The second guard 18 is placed at the first liquid receiving position when the second guard 18 functions as a guard for a low-affinity processing liquid (see FIG. 3B). The third guard 19 is placed at the first liquid receiving position when the third guard 19 functions as a guard for a low-affinity processing liquid (see FIG. 3C).

Additionally, all processing liquids may be received by one of the plurality of guards 17 to 19. For example, the first guard 17 may receive all processing liquids. In this case, the first guard 17 functions as a guard for a low-affinity processing liquid and as a guard for a high-affinity processing liquid. Additionally, the first guard raising/lowering unit functions as a guard raising/lowering unit for a low-affinity processing liquid and as a guard raising/lowering unit for a high-affinity processing liquid. As a matter of course, the second guard 18 may receive all processing liquids, or the third guard 19 may receive all processing liquids.

The present invention can be embodied in still other modes without being limited to the aforementioned preferred embodiments.

For example, the number of guards is not limited to three. Four or more guards may be provided, or two guards may be provided. Additionally, the number of guards may be one.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

This application corresponds to Japanese Patent Application No. 2017-163538 filed in the Japan Patent Office on Aug. 28, 2017, and the entire disclosure of the application is incorporated herein by reference.

REFERENCE SIGNS LIST

1: Substrate processing apparatus
3: Controller
6: Facing member
8: Chemical liquid supply unit (Processing liquid supply unit, Low-affinity processing liquid supply unit, High-affinity processing liquid supply unit)
9: Rinsing liquid supply unit (Processing liquid supply unit, Low-affinity processing liquid supply unit)
10: Organic solvent supply unit (Processing liquid supply unit, High-affinity processing liquid supply unit)
11: Water repellent supply unit (Processing liquid supply unit, High-affinity processing liquid supply unit)
12: Supporting member raising/lowering unit (Facing member raising/lowering unit)
17: First guard (Guard for low-affinity processing liquid, Guard for high-affinity processing liquid)
18: Second guard (Guard for high-affinity processing liquid, Guard for low-affinity processing liquid)
19: Third guard (Guard for high-affinity processing liquid, Guard for low-affinity processing liquid)
23: Electric motor (Substrate rotating unit, Facing-member rotating unit)
24: Substrate holding unit
27: First guard raising/lowering unit (Guard raising/lowering unit for low-affinity processing liquid, Guard raising/lowering unit for high-affinity processing liquid)
28: Second guard raising/lowering unit (Guard raising/lowering unit for high-affinity processing liquid, Guard raising/lowering unit for low-affinity processing liquid)
29: Third guard raising/lowering unit (Guard raising/lowering unit for high-affinity processing liquid, Guard raising/lowering unit for low-affinity processing liquid)
61: Extension portion
61$a$: Inner peripheral surface
A1: Rotational axis
W: Substrate

The invention claimed is:

1. A substrate processing method comprising:
a substrate rotating step of rotating a substrate that is held horizontally around a rotational axis extending in a vertical direction;
a facing member placing step of placing a facing member that includes an extension portion having an inner peripheral surface surrounding the substrate in a plan view and that faces the substrate from above at a position at which the inner peripheral surface of the extension portion faces the substrate from an outer side in a radial direction that centers on the rotational axis;
a facing member rotating step of rotating the facing member around the rotational axis;
a processing-liquid supplying step of supplying a processing liquid to an upper surface of the substrate being in a rotated state; and
a guard placing step of placing a guard that surrounds the substrate at a further outer side in the radial direction than the extension portion in a plan view at a height position, at which the processing liquid that is scattered from the upper surface of the substrate to the outer side in the radial direction is received by the guard, in accordance with affinity of the processing liquid for the inner peripheral surface of the extension portion.

2. The substrate processing method according to claim 1, wherein the processing-liquid supplying step includes a low-affinity processing liquid supplying step of supplying a low-affinity processing liquid to the upper surface of the substrate and a high-affinity processing liquid supplying step of supplying a high-affinity processing liquid whose affinity for the inner peripheral surface of the extension portion is higher than the low-affinity processing liquid to the upper surface of the substrate, and
the guard placing step includes a first placing step of placing the guard at a first liquid receiving position when the guard receives the low-affinity processing liquid and a second placing step of placing the guard at a second liquid receiving position lower than the first liquid receiving position when the guard receives the high-affinity processing liquid.

3. The substrate processing method according to claim 2, wherein the first placing step includes a step of placing the guard at the first liquid receiving position such that an upper end of the guard is placed at a position higher than the upper surface of the substrate, and
the second placing step includes a step of placing the guard at the second liquid receiving position such that the upper end of the guard is placed at a position lower than the upper surface of the substrate and at a position higher than a lower end portion of the extension portion.

4. The substrate processing method according to claim 2, wherein the processing-liquid supplying step includes a first replacing step of replacing the low-affinity processing liquid on the upper surface of the substrate with the high-affinity processing liquid by performing the high-affinity processing liquid supplying step after completing the low-affinity processing liquid supplying step, and the guard placing step includes a step of changing the height position of the guard such that the guard is placed at the first liquid receiving position when the first replacing step is started and so that the guard is placed at the second liquid receiving position after the first replacing step is ended.

5. The substrate processing method according to claim 2, wherein the processing-liquid supplying step includes a second replacing step of replacing the high-affinity processing liquid on the upper surface of the substrate with the low-affinity processing liquid by performing the low-affinity processing liquid supplying step after completing the high-affinity processing liquid supplying step, and the guard placing step includes a step of changing the height position of the guard such that the guard is placed at the second liquid receiving position when the second replacing step is started and such that the guard is placed at the first liquid receiving position after the second replacing step is ended.

6. The substrate processing method according to claim 2, wherein the guard includes a guard for a low-affinity processing liquid that receives the low-affinity processing liquid and a guard for a high-affinity processing liquid that receives the high-affinity processing liquid, and the guard placing step includes a low-affinity-processing-liquid-guard placing step of placing the guard for the low-affinity processing liquid at the first liquid receiving position and a high-affinity-processing-liquid-guard placing step of placing the guard for the high-affinity processing liquid at the second liquid receiving position.

7. The substrate processing method according to claim 1, wherein the guard placing step includes a step of adjusting a position of the guard such that the guard is placed at a higher position in proportion to an increase in rotational speed of the substrate.

8. A substrate processing apparatus comprising:
a substrate holding unit that horizontally holds a substrate;
a substrate rotating unit that rotates the substrate around a rotational axis that extends in a vertical direction;
a processing liquid supply unit that supplies a processing liquid to an upper surface of the substrate;
a facing member that includes an extension portion having an inner peripheral surface surrounding the substrate in a plan view and that faces the substrate from above;
a guard that surrounds the substrate at a further outer side in a radial direction that centers on the rotational axis than the extension portion in a plan view;
a guard raising/lowering unit that raises and lowers the guard;
a facing member raising/lowering unit that raises and lowers the facing member;
a facing-member rotating unit that rotates the facing member around the rotational axis; and
a controller that controls the substrate rotating unit, the processing liquid supply unit, the guard raising/lowering unit, the facing member raising/lowering unit, and the facing-member rotating unit, the controller being programmed to execute:
a substrate rotating step of rotating the substrate that is held horizontally around the rotational axis by means of the substrate rotating unit;
a facing member placing step of placing the facing member at a position at which the inner peripheral surface of the extension portion faces the substrate from an outer side in the radial direction by means of the facing member raising/lowering unit;
a facing member rotating step of rotating the facing member around the rotational axis by means of the facing-member rotating unit;
a processing-liquid supplying step of supplying the processing liquid from the processing liquid supply unit to the upper surface of the substrate being in a rotated state; and
a guard placing step of placing the guard at a height position, at which the processing liquid that is scattered from the upper surface of the substrate to the outer side in the radial direction is received by the guard, in accordance with affinity of the processing liquid for the inner peripheral surface of the extension portion by means of the guard raising/lowering unit.

* * * * *